United States Patent
Bolotnikov et al.

(10) Patent No.: US 10,388,737 B2
(45) Date of Patent: Aug. 20, 2019

(54) ELECTRIC FIELD SHIELDING IN SILICON CARBIDE METAL-OXIDE-SEMICONDUCTOR (MOS) DEVICES HAVING AN OPTIMIZATION LAYER

(71) Applicant: General Electric Company, Schenectady, NY (US)

(72) Inventors: Alexander Viktorovich Bolotnikov, Niskayuna, NY (US); Peter Almern Losee, Clifton Park, NY (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 42 days.

(21) Appl. No.: 15/601,754

(22) Filed: May 22, 2017

(65) Prior Publication Data
US 2017/0338303 A1 Nov. 23, 2017

Related U.S. Application Data

(60) Provisional application No. 62/340,396, filed on May 23, 2016.

(51) Int. Cl.
*H01L 29/16* (2006.01)
*H01L 21/04* (2006.01)
(Continued)

(52) U.S. Cl.
CPC ........ *H01L 29/1608* (2013.01); *H01L 21/046* (2013.01); *H01L 21/0465* (2013.01);
(Continued)

(58) Field of Classification Search
CPC .............. H01L 29/1608; H01L 29/063; H01L 29/0646; H01L 29/0696; H01L 29/1095; H01L 29/7395; H01L 29/7802
(Continued)

(56) References Cited

U.S. PATENT DOCUMENTS 6,207,993 B1    3/2001  Ishimura et al.
7,385,248 B2    6/2008  Herrick et al.
(Continued)

FOREIGN PATENT DOCUMENTS

CN    202816955 U    3/2013
CN    103840007 A    6/2014
(Continued)

OTHER PUBLICATIONS

International Search Report and Written Opinion issued in connection with corresponding PCT Application No. PCT/US2017/034088 dated Aug. 4, 2017.
(Continued)

*Primary Examiner* — Bo B Jang
(74) *Attorney, Agent, or Firm* — GE Global Patent Operation; John Darling

(57) ABSTRACT

The subject matter disclosed herein relates to silicon carbide (SiC) power devices. In particular, the present disclosure relates to shielding regions for use in combination with an optimization layer. The disclosed shielding regions reduce the electric field present between the well regions of neighboring device cells of a semiconductor device under reverse bias. The disclosed shielding regions occupy a portion of the JFET region between adjacent device cells and interrupt the continuity of the optimization layer in a widest portion of the JFET region, where the corners of neighboring device cells meet. The disclosed shielding regions and device layouts enable superior performance relative to a conventional stripe device of comparable dimensions, while still providing similar reliability (e.g., long-term, high-temperature stability at reverse bias).

18 Claims, 17 Drawing Sheets

(51) Int. Cl.
    *H01L 29/66*    (2006.01)
    *H01L 29/78*    (2006.01)
    *H01L 29/739*   (2006.01)
    *H01L 29/06*    (2006.01)
    *H01L 29/10*    (2006.01)
    *H01L 29/745*   (2006.01)
    *H01L 29/74*    (2006.01)

(52) U.S. Cl.
    CPC ........ *H01L 29/063* (2013.01); *H01L 29/0623* (2013.01); *H01L 29/0646* (2013.01); *H01L 29/0696* (2013.01); *H01L 29/1095* (2013.01); *H01L 29/66068* (2013.01); *H01L 29/7395* (2013.01); *H01L 29/7455* (2013.01); *H01L 29/78* (2013.01); *H01L 29/7802* (2013.01); *H01L 29/7816* (2013.01); *H01L 29/7393* (2013.01); *H01L 29/74* (2013.01)

(58) Field of Classification Search
    USPC ...... 257/76, 77, E21.054, E21.055, E21.065
    See application file for complete search history.

(56) References Cited

U.S. PATENT DOCUMENTS

| | | |
|---|---|---|
| 8,212,321 B2 | 7/2012 | Lamey et al. |
| 8,378,416 B2 | 2/2013 | Darwish et al. |
| 8,421,148 B2 | 4/2013 | Harris et al. |
| 8,674,440 B2 | 3/2014 | Korec |
| 8,704,295 B1 | 4/2014 | Darwish et al. |
| 2001/0001494 A1 | 5/2001 | Kocon |
| 2002/0056871 A1 | 5/2002 | Kocon et al. |
| 2003/0227052 A1 | 12/2003 | Ono et al. |
| 2004/0099885 A1 | 5/2004 | Yeo et al. |
| 2004/0164304 A1 | 8/2004 | Magri et al. |
| 2005/0012143 A1 | 1/2005 | Tanka et al. |
| 2007/0102725 A1 | 5/2007 | Magri' et al. |
| 2013/0200451 A1 | 8/2013 | Yilmaz et al. |
| 2013/0313570 A1 | 11/2013 | Sdrulla et al. |
| 2014/0231867 A1 | 8/2014 | Yamashita et al. |
| 2014/0231912 A1 | 8/2014 | Willmeroth et al. |
| 2015/0155355 A1 | 6/2015 | Losee et al. |
| 2015/0372088 A1 | 12/2015 | Bolotnikov et al. |
| 2015/0372089 A1 | 12/2015 | Bolotnikov et al. |
| 2017/0338300 A1 | 11/2017 | Bolotnikov et al. |
| 2017/0338313 A1 | 11/2017 | Bolotnikov et al. |
| 2017/0345890 A1 | 11/2017 | Losee et al. |

FOREIGN PATENT DOCUMENTS

| | | |
|---|---|---|
| DE | 102004009602 B4 | 9/2009 |
| EP | 1 873 838 A1 | 1/2008 |
| EP | 2058854 A2 | 5/2009 |
| EP | 2 083 449 A2 | 7/2009 |

OTHER PUBLICATIONS

Bolotnikov, A. V., et al., Electric field shielding in silicon carbide metal-oxide-semiconductor (mos) Device Cells, GE Co-Pending U.S. Appl. No. 62/340,396, filed May 23, 2016.

US 10,388,737 B2

ELECTRIC FIELD SHIELDING IN SILICON CARBIDE METAL-OXIDE-SEMICONDUCTOR (MOS) DEVICES HAVING AN OPTIMIZATION LAYER

CROSS-REFERENCE TO RELATED APPLICATIONS

This application claims priority from and the benefit of U.S. Provisional Application Ser. No. 62/340,396, entitled "ELECTRIC FIELD SHIELDING IN SILICON CARBIDE METAL-OXIDE-SEMICONDUCTOR (MOS) DEVICE CELLS," filed May 23, 2016, which is hereby incorporated by reference in its entirety for all purposes.

BACKGROUND

The subject matter disclosed herein relates to semiconductor power devices, such as silicon carbide (SiC) power devices, including field transistors (e.g., MOSFET, DMOSFET, UMOSFET, VMOSFET, trench MOSFET, etc.), insulated gate bipolar transistors (IGBT), and insulated base MOS-controlled thyristors (IBMCT).

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Power conversion devices are widely used throughout modern electrical systems to convert electrical power from one form to another form for consumption by a load. Many power electronics systems utilize various semiconductor devices and components, such as thyristors, diodes, and various types of transistors (e.g., metal-oxide-semiconductor field-effect transistor (MOSFETs), insulated gate bipolar transistors (IGBTs), and other suitable transistors).

Specifically for high-frequency, high-voltage, and/or high-current applications, silicon carbide (SiC) devices, may provide a number of advantages in terms of high temperature operation, reduced conduction and switching losses, and smaller die size than corresponding silicon (Si) devices. However, SiC also presents a number of technical and design challenges relative to Si, such as lower dopant diffusion during SiC device fabrication and higher electric fields within SiC devices during operation (e.g., under reverse bias). While the SiC portions of a SiC device may be robust to these higher electric fields, other portions of the SiC device, such as silicon oxide ($SiO_2$) dielectric layers, may fail under these higher electric fields. Accordingly, it is desirable to develop SiC device designs that reduce high electric fields to improve device reliability without substantially diminishing device performance.

BRIEF DESCRIPTION

In an embodiment, a device includes a plurality of device cells at least partially disposed in a semiconductor device layer having a first conductivity type. Each device cell includes a drift layer having a first conductivity type and an optimization layer extending from a surface of the semiconductor device layer to the drift layer and having the first conductivity type, wherein the optimization layer has an average doping concentration that is greater than an average doping concentration of the drift layer. Each device cell also includes a source region having the first conductivity type at least partially disposed within the optimization layer, a channel region having a second conductivity type at least partially disposed within the optimization layer adjacent to the source region; and a JFET region having the first conductivity type and the second doping concentration disposed within the optimization layer between the channel regions of the plurality of device cells, wherein the JFET region has a parallel JFET width between the well region of the device cell and a parallel portion of a well region of a neighboring device cell. The device further comprises a plurality of shielding regions disposed within the optimization layer (SROLs) having the first conductivity type and the first doping concentration, wherein the plurality of SROLs are at least partially disposed within a portion of the JFET region between the channel regions of neighboring device cells of the plurality of device cells.

In another embodiment, method of manufacturing includes masking a portion of a surface a semiconductor layer, wherein the semiconductor layer has an initial doping concentration of a first conductivity type. The method includes doping the semiconductor layer with dopant of the first conductivity type to form an optimization layer, wherein the optimization layer extends a first depth into the surface of the semiconductor layer, has a peak doping concentration greater than the initial doping concentration, and includes a plurality of shielding regions within the optimization layer (SROLs) having the initial doping concentration. The method further includes implanting well regions and source regions of the plurality of device cells within the optimization layer, wherein the well regions extend a second depth into the surface of the semiconductor layer that is less than the first depth, wherein the well regions define channel regions of the plurality of device cells, and wherein the plurality of SROLs are disposed between portions of the channel regions of neighboring device cells of the plurality of device cells.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. It may be appreciated that the shapes, positions, and alignments of features presently disclosed are, for the sake of simplicity, illustrated and described as being relatively ideal (e.g., square, rectangular, and hexagonal cells and shielding regions with perfectly straight and aligned features). However, as may be appreciated by one of skill in the art, process variations and technical limitations may result in cellular designs with less than ideal shapes or irregular features may still be within the spirit of the present technique. As such, the term "substantially" as used herein to describe a shape, a position, or an alignment of a feature is meant to encompass ideal or target shapes, positions, and alignments as well as imperfectly implemented shapes, positions, and alignments resulting from variability in the semiconductor fabrication process, as may be appreciated by one skilled in the art. Additionally, semiconductor device cells are described herein as being disposed or fabricated "at the surface," "in the surface," "on the surface," or "along the surface" of a semiconductor layer, which is intended to include semiconductor device cells having portions disposed within the bulk of the semiconductor layer, portions disposed proximate to the surface of the semiconducting layer, portions disposed even with the surface of the semiconductor layer, and/or portions disposed above or on top of the surface of the semiconductor layer.

Figure 1A:
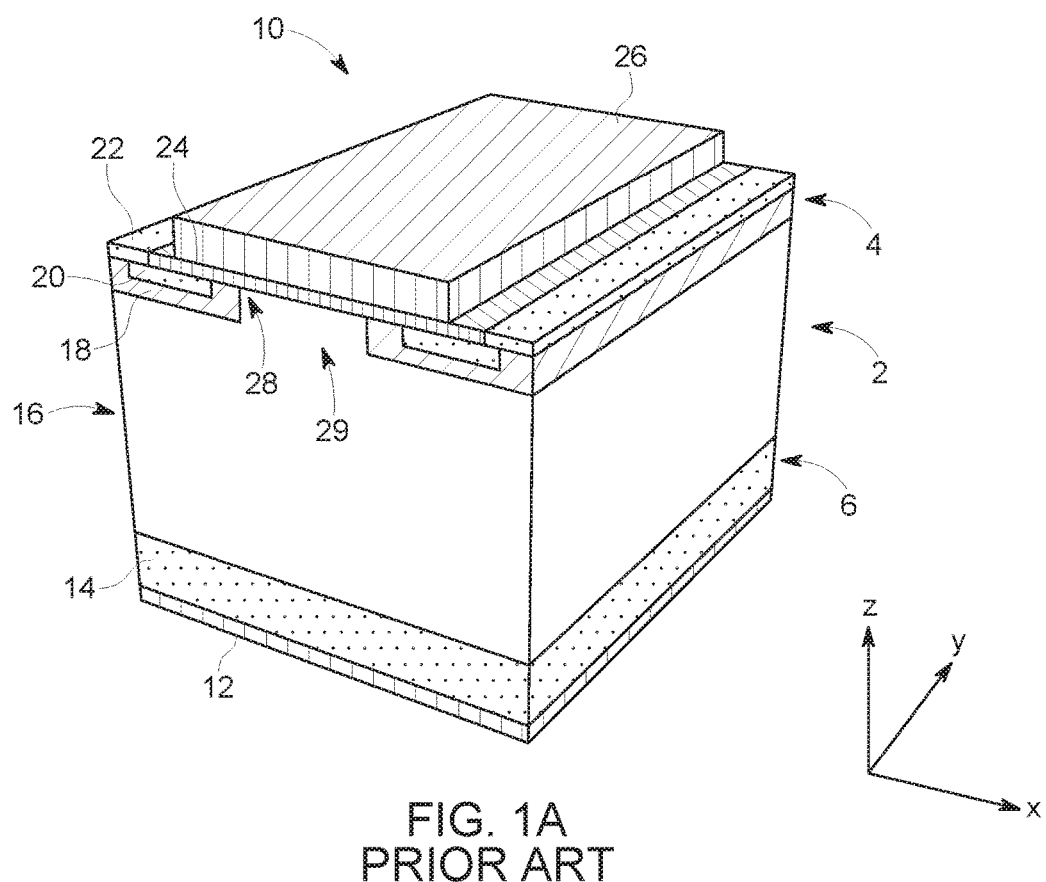
FIG. 1A is a schematic of a typical planar MOSFET device.

One of the essential building blocks of modern power electronics is the field-effect transistor (FET) device. For example, FIG. 1A illustrates an active cell of a planar n-channel field-effect transistor, namely a DMOSFET, hereinafter MOSFET device 10. It may be appreciated that, in order to more clearly illustrate certain components of the MOSFET device 10, as well as other devices discussed below, certain commonly understood design elements (e.g., top metallization, passivation, edge termination, and so forth) may be omitted.

The illustrated MOSFET device 10 of FIG. 1A includes a semiconductor device layer 2 (e.g., an epitaxial SiC layer) having a first surface 4 and a second surface 6. The semiconductor device layer 2 includes a drift region 16 having a first conductivity type (e.g., an n-type drift layer 16), a well region 18 having a second conductivity type (e.g., a p-well 18) disposed adjacent to the drift region 16 and proximal to the first surface 4. The semiconductor device layer 2 also includes a source region 20 having the first conductivity type (e.g., n-type source region 20) adjacent to the well region 18 and proximal to the first surface 4. A dielectric layer 24 (also referred to as a gate insulating layer or gate dielectric layer)

is disposed on a portion of the first surface 4 of the semiconductor device layer 2, and a gate electrode 26 is disposed on the dielectric layer 24. The second surface 6 of the semiconductor device layer 2 is a substrate layer 14 (e.g., a SiC substrate layer), and the drain contact 12 is disposed on the bottom of device 10 along the substrate layer 14.

During on-state operation, an appropriate gate voltage (e.g., at or beyond a threshold voltage ($V_{TH}$) of the MOSFET device 10) may cause an inversion layer to be formed in the channel region 28, as well as a conductive path to be enhanced in the junction field-effect transistor (JFET) region 29 due to accumulation of carriers, allowing current to flow from the drain contact 12 (i.e., the drain electrode) to the source contact 22 (i.e., the source electrode). It should be appreciated that, for the MOSFET devices discussed herein, the channel region 28 may be generally defined as an upper portion of the well region 18 disposed below the gate electrode 26 and gate dielectric 24. Furthermore, while the present approach may be discussed below in the context of SiC MOSFET devices, it should be appreciated the present approach may be applicable to other types of material systems (e.g., silicon (Si), germanium (Ge), aluminum nitride (AlN), gallium nitride (GaN), gallium arsenide (GaAs), diamond (C), or any other suitable wide band-gap semiconductor) as well as other types of device structures (e.g., UMOSFET, VMOSFETs, insulated gate bipolar transistors (IGBT), insulated base MOS-controlled thyristors (IBMCT), or any other suitable FET and/or MOS device) utilizing both n- and p-channel designs.

Figure 1B:
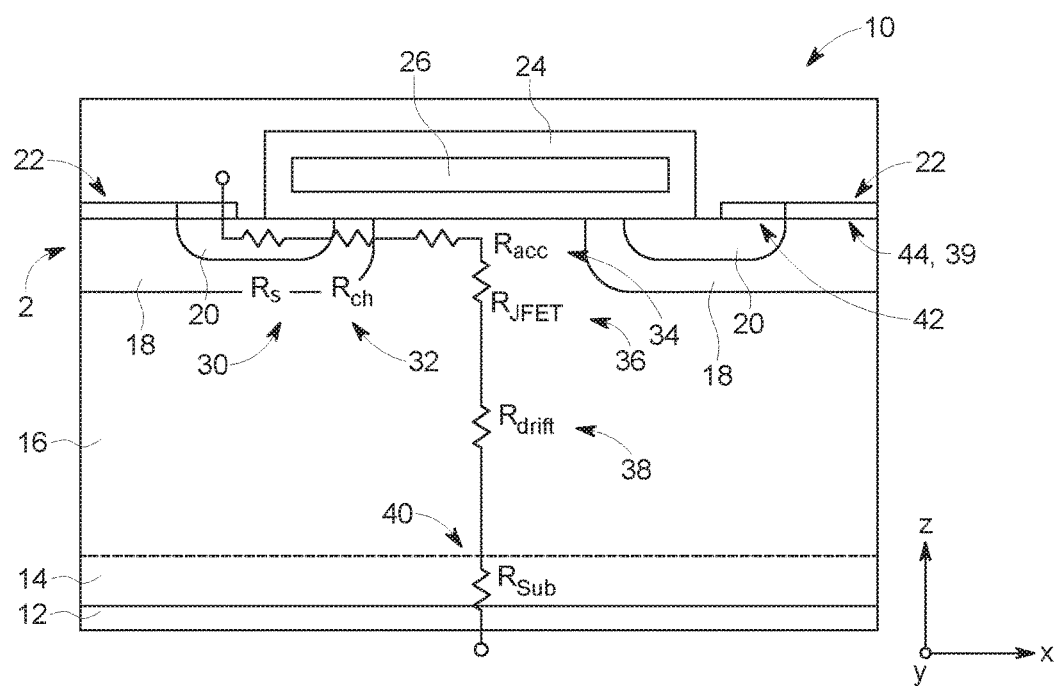
FIG. 1B is a schematic illustrating resistances for various regions of a typical MOSFET device.

FIG. 1B is a schematic cross-sectional view of the SiC device 10 of FIG. 1A. The source contacts 22 of the MOSFET device 10 illustrated in FIG. 1B generally provide an ohmic connection to the source electrode, and are disposed over both a portion of the source regions 20 and a portion of the well regions 18. The source contact 22 is generally a metallic interface comprising one or more metal layers situated between these semiconductor portions of the MOSFET device 10 and the metallic source electrode. For clarity, the portion of the source region 20 (e.g., n+ source region 20) of the MOSFET device 10 disposed below the contact 22 may be more specifically referred to herein as a source contact region 42 of the MOSFET device 10. Similarly, a portion of the well region 18 of the MOSFET device 10, which may be doped at a higher level than the remainder of the well region 18, may be more specifically referred to herein as a body region 39 (e.g., p+ body region 39) of the MOSFET device 10. For clarity, the portion of the body region 39 that is disposed below (e.g., covered by, directly electrically connected to) the contact 22, may be more specifically referred to herein as a body contact region 44 (e.g., p+ body contact region 44) of the MOSFET device 10.

As illustrated in FIG. 1B, the various regions of the MOSFET device 10 may each have an associated resistance, and a total resistance (e.g., an on-state resistance, $R_{ds}$(on)) of the MOSFET device 10, which may be represented as a sum of each of these resistances. For example, as illustrated in FIG. 1B, on-state resistance, $R_{ds}$(on), of the MOSFET device 10 may be approximated as a sum of: a resistance $R_s$ 30 (e.g., a resistance of source region 20 and a resistance of the contact 22); a resistance $R_{ch}$ 32 (e.g., an inversion channel resistance of the region 28 illustrated in FIG. 1A); a resistance $R_{acc}$ 34 (e.g., a resistance of an accumulation layer between the gate oxide 24 and portion of drift layer 16 located between well regions 18); a resistance $R_{JFET}$ 36 (e.g., resistance of undepleted neck region between well regions 18); a resistance $R_{drift}$ 38 (e.g., the resistance about the drift layer 16); and a resistance $R_{sub}$ 40 (e.g., the resistance about the substrate layer 14). Note that the resistances illustrated in FIG. 1B are not intended to be exhaustive, and that other resistances (e.g., drain contact resistance, spreading resistance, etc.) could potentially be present within the semiconductor device 10.

In certain cases, one or two resistance components illustrated in FIG. 1B may dominate conduction losses of the semiconductor device 10, and addressing these factors can significantly impact $R_{ds}$(on). For example, for devices in which the drift resistance 38, the substrate resistance 40 and the contact resistance 30 are less significant (compared to other resistance components), such as low-voltage devices or devices suffering from low inversion layer mobility (e.g. SiC devices), the channel resistance ($R_{ch}$ 32) may account for a significant portion of device conduction losses. By further example, in medium- and high-voltage devices, JFET region resistance ($R_{JFET}$ 36) may account for a significant portion of total conduction losses.

Figure 2:
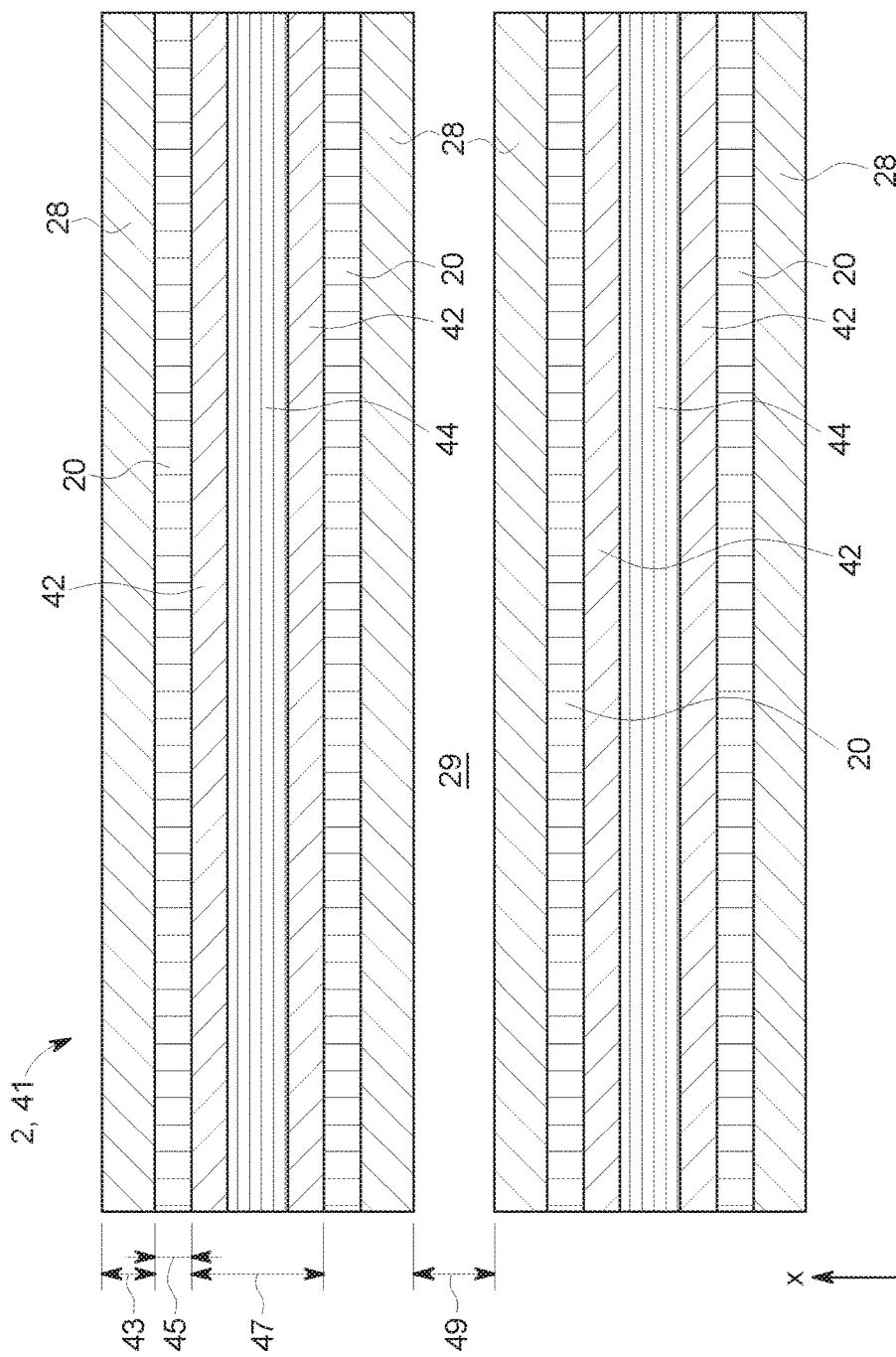
FIG. 2 is a top-down view of a surface of a SiC layer that includes a typical MOSFET device structure having a stripe cell layout.

FIG. 2 illustrates a top-down view of a semiconductor device layer 2 including a MOSFET device structure 41 having a conventional stripe cell layout. In terms of dimensions, the conventional MOSFET device structure 41 may be described as having a particular channel length ($L_{ch}$ 43), length from channel region to ohmic region ($L_{ch\_to\_ohm}$ 45), width of the ohmic region ($W_{ohm}$ 47), and width of the JFET region ($W_{JFET}$ 49). While the conventional stripe cell layout illustrated in FIG. 2 offers good reliability (e.g., long term and high temperature performance), the relatively high channel resistance ($R_{ch}$ 32) and JFET resistance ($R_{JFET}$ 36) of the MOSFET device structure 41 results in a relatively high $R_{ds}$(on), which diminishes the electrical performance of the device.

Figure 3:
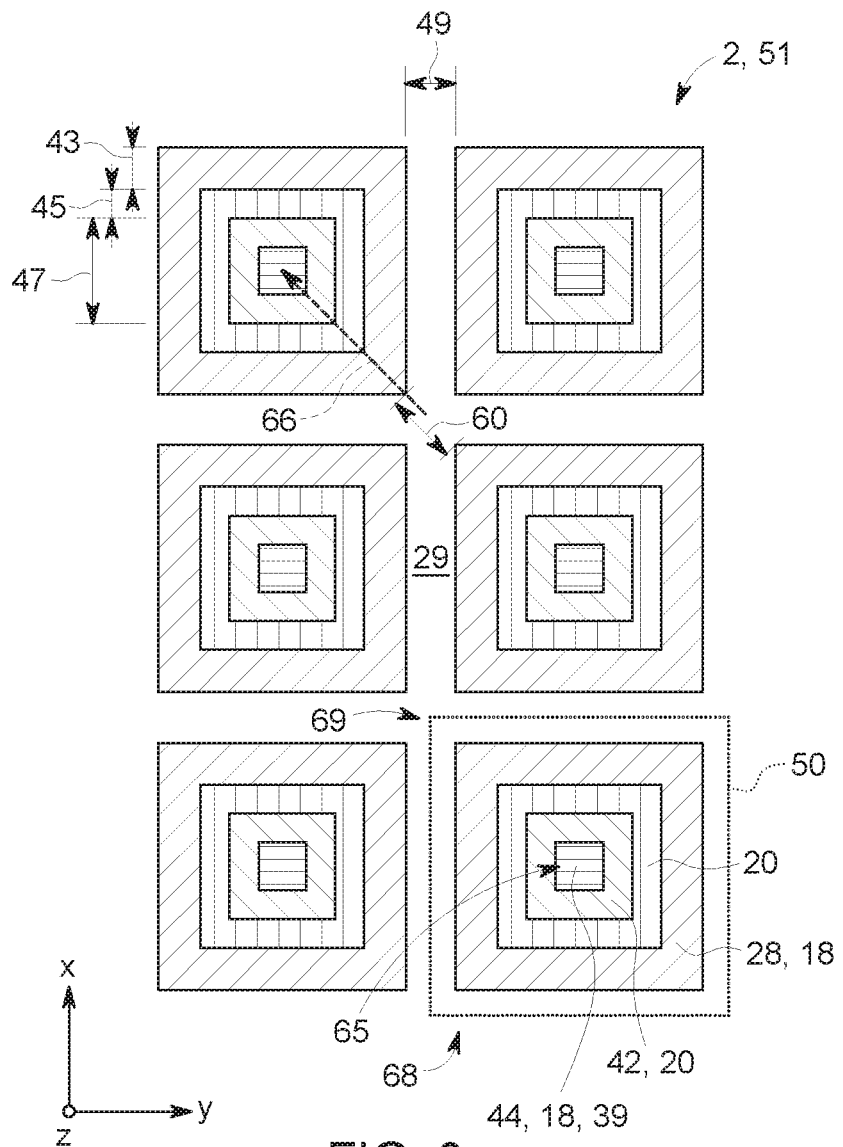
FIG. 3 is a top-down view of a SiC layer that includes a number of square semiconductor device cells.
Figure 4:
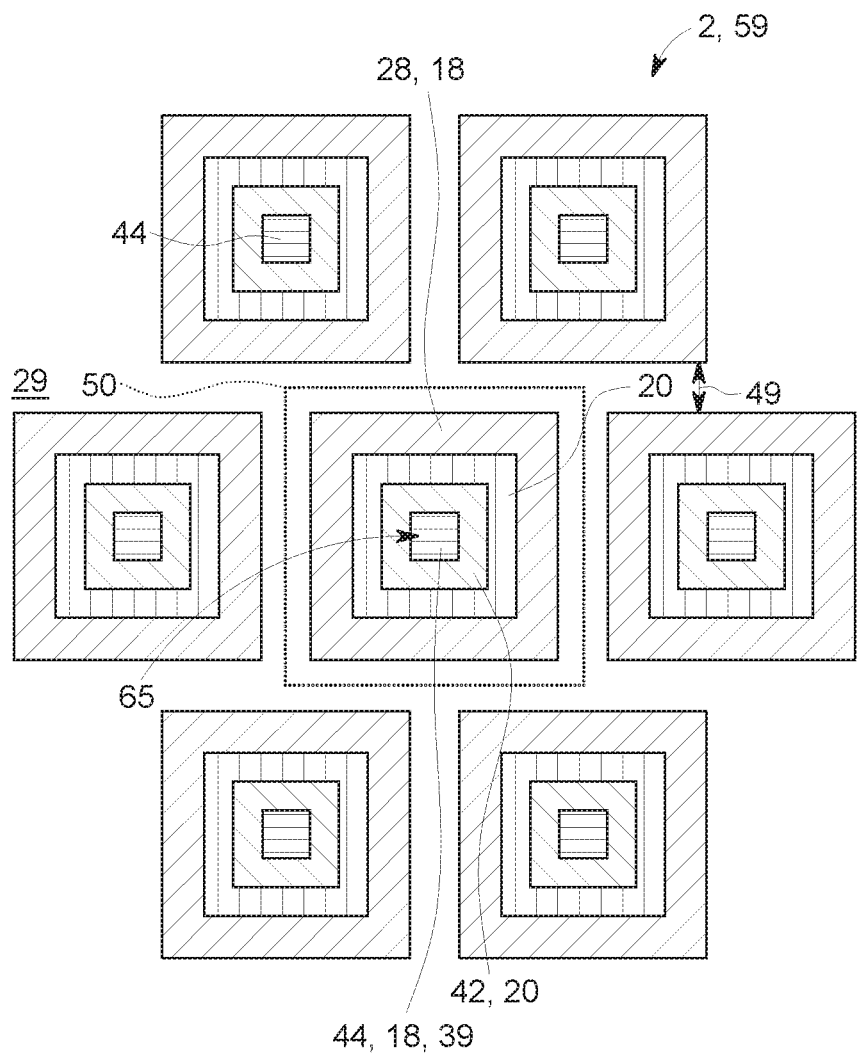
FIG. 4 is a top-down view of a SiC layer that includes a number of staggered square semiconductor device cells.
Figure 5:
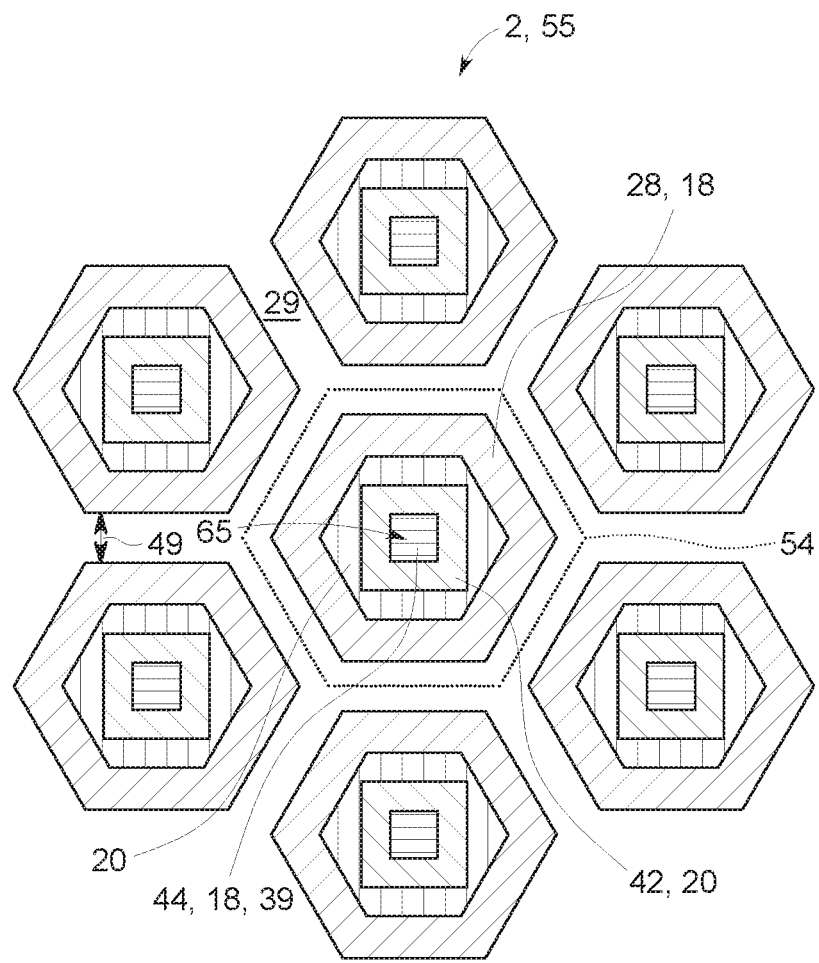
FIG. 5 is a top-down view of a SiC layer that includes a number of hexagonal semiconductor device cells.

One way in which channel resistance ($R_{ch}$ 32) and JFET resistance ($R_{JFET}$ 36) can be reduced for semiconductor devices is through the use of cellular device designs. FIGS. 3-5 illustrate top-down views of a semiconductor device layer 2 having different conventional cellular designs and layouts. These conventional designs may be described as being unshielded relative to the shielded device cells of the present technique discussed below. It may be appreciated that for FIGS. 3-5, as well as for the top-down views of device cells presented below, certain features of the device cells (e.g., gate contact 26, dielectric layer 24, contacts 22) are omitted to provide an unobstructed view of the surface of the semiconductor device layer 2. In particular, FIG. 3 illustrates square device cells 50 in an aligned layout 51, while FIG. 4 illustrates the square cellular device cells 50 in a staggered or offset layout 52. FIG. 5 illustrates hexagonal device cells 54 in an aligned layout 55. In general, the illustrated cell designs and layouts illustrated in FIGS. 3-5 enable reduced $R_{ds}$(on) by reducing both channel resistance ($R_{ch}$ 32) and the JFET resistance ($R_{JFET}$ 36) relative to a stripe cell layout, as illustrated in FIG. 2. For example, the square device cells 50 of FIG. 3 provide an approximately 20% lower $R_{ds}$(on) than the stripe device 41 of FIG. 2, assuming similar process/technology limited dimensions (e.g., same $L_{ch}$ 43, $L_{ch\_to\_ohm}$ 45, $W_{ohm}$ 47, and $W_{JFET}$ 49). It may be appreciated that the layouts illustrated herein using a few device cells that represent a subset of the numerous device cells of a semiconductor device on the semiconductor surface 2.

In FIGS. 3-5, the illustrated conventional square device cell 50 and hexagonal device cell 54 each include a body contact region 44 disposed in the center 65 of each cell that, as illustrated in FIG. 1B, is part of the well region 18. The body contact region 44 is surrounded by a source region 20. More specifically, the body contact region 44 of each cell may be surrounded by the source contact region 42 of the source region 20, wherein the doping of the source contact region 42 may be the same as the remainder of the source region 20. The source region 20 of each cell is surrounded by a channel region 28, which also is part of the well region 18, as illustrated in FIGS. 1A and 1B. The channel region 28 is, in turn, surrounded by the JFET region 29. In general, the width of a particular part of the JFET region 29 is defined as the shortest distance between regions having the opposite doping type (e.g., p-type) compared that of JFET region 29 (e.g., n-type). While each device cell includes a JFET region 29 about the perimeter of the cell, these JFET regions 29 may, at times, be collectively referred to as the JFET region 29 of the semiconductor device layer 2 for simplicity. It may also be appreciated that the semiconductor device layer 2, the source region 20, including the source contact region 42, and the JFET region 29 have a first conductivity type (e.g., n-type), while well region 18, including the body contact region 44 and the channel region 28 have a second conductivity type (e.g., p-type). As used herein, two device cells may be referred to as neighboring cells or adjacent cells when any portion of the boundaries of the two cells touch (e.g., along a side 68 or at a corner 69 of the boundary the device cells). As such, it may be appreciated that, each square device cell 50 of FIG. 3 has eight neighboring or adjacent cells, while each staggered square cell 50 of FIG. 4 and each hexagonal device cell 54 of FIG. 5 has six neighboring or adjacent cells.

While the cellular designs illustrated in FIGS. 3-5 may enable lower $R_{ds}(on)$ relative to a stripe cell layout, as illustrated in FIG. 2, it is presently recognized that such cellular designs can have a substantially higher electric field in portions of the JFET region 29 between the corners of the well regions of neighboring device cells under blocking conditions. For SiC MOS devices, the electric field in the dielectric layer 24 (e.g., $SiO_2$) disposed over the JFET region 29 (illustrated in FIGS. 1 and 2) may be around ten times higher compared to that in Si devices when the device cells operate under reverse bias. While SiC is generally robust toward higher electric fields, the dielectric layer 24 may experience breakdown during long term operation, resulting in reliability issues with the SiC device cells 50 and 54.

In particular, in a SiC MOSFET under reverse bias, the electric field present in the widest portion of the JFET region 29 between the corners of the well regions of neighboring device cells 50 and 54 illustrated in FIGS. 3-5 is substantially higher than in other portions of the JFET region 29. As illustrated in FIG. 3, the diagonal distance 60 between the corners of the channel regions 28 of the device cells 50 is greater than the distance 49 between parallel portions (i.e., $W_{JFET,parallel}$ 49) of the channel regions 28 of neighboring device cells 50. As a result, the peak electric field in the dielectric layer 24 is greater between the corners of the well regions 18 of neighboring device cells 50 (e.g., between the corners of the channel regions 28 of neighboring device cells, at the corner 69 where neighboring cells meet), which may result in long term reliability issues for such unshielded device cells 50.

Figure 6:
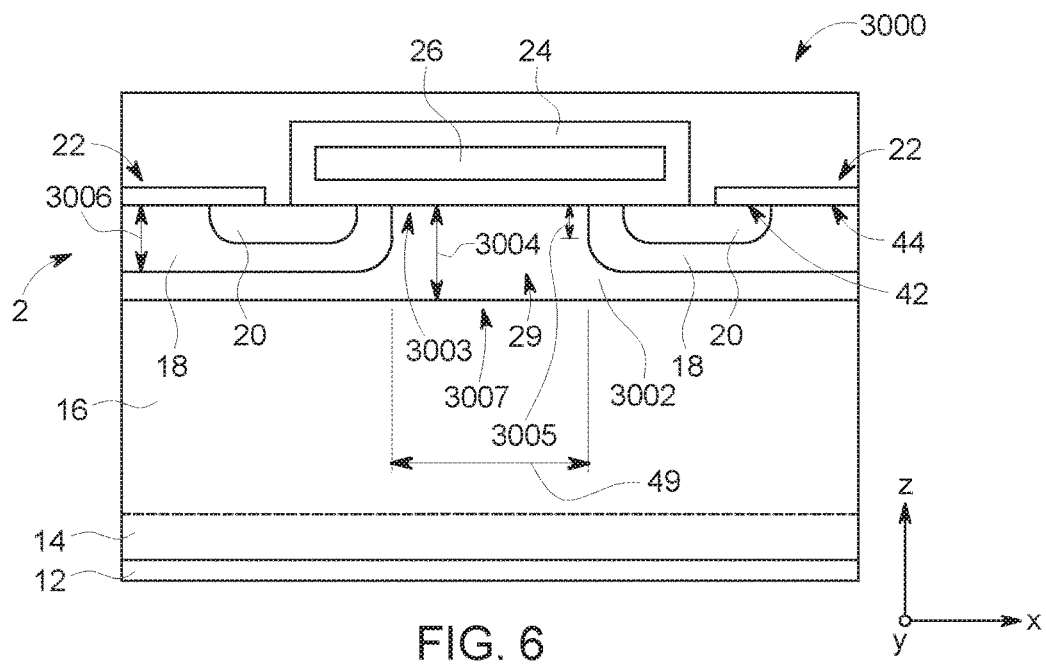
FIG. 6 is cross-sectional schematic of a portion of a MOSFET device having an optimization layer, in accordance with embodiments of the present technique.

For embodiments of the present approach, the semiconductor device layer 2 includes an optimization layer generally disposed between the drift layer 16 and the surface of the semiconductor device layer 2 that improves device performance. A cross-sectional schematic of a portion of a semiconductor device 3000 (e.g., MOSFET 3000) having an optimization layer 3002 is illustrated in FIG. 6. In certain embodiments, the optimization layer 3002 may include one or more features disclosed in co-pending U.S. application Ser. No. 15/164,928, filed May 26, 2016, entitled, "SEMICONDUCTOR DEVICE AND METHOD OF MAKING THEREOF," which is incorporated herein by reference its entirety for all purposes.

In general, the disclosed optimization layer 3002 has the same conductivity type (e.g., n-type), and a higher doping concentration (e.g., between approximately two (2) and fifteen (15) times greater) than the drift region 16 of the device 3000. The disclosed optimization layer 3002 generally reduces the resistance in the JFET region 29 and portion of the drift layer, which improves device performance by reducing conduction losses. Additionally, in certain embodiments, the optimization layer 3002 may have a sufficiently high surface doping to act similarly to an adjust layer, lowering the threshold voltage of the MOSFET 3000 by compensating for the opposite doping (e.g., p-type) of the well region 18. It may be appreciated that, unlike typical adjust layers, the disclosed optimization layer 3002 can have a depth 3004 that is greater than or equal to the depth 3006 of the well region 18, and further, both the active region and the termination region of the device cells may be disposed within (e.g., surrounded by) the optimization layer 3002.

In certain embodiments, the optimization layer 3002 may be formed by an implantation or diffusion process (e.g., a blanket doping process) that can occur before, after, or in-between the formation of other features (e.g., well regions 18, source regions 20) of the device cells. An average dopant concentration within the optimization layer 3002 may be between about two (2) times to about fifteen (15) times greater than the an average dopant concentration of the drift region 16. Additionally, in certain embodiments, the optimization layer 3002 may have a retrograde doping profile.

In a retrograde doping profile, a dopant concentration of the optimization layer 3002 may increase from a first, lower dopant concentration at a surface 3003 of the optimization layer 3002 (e.g. at the surface of the semiconductor device layer 2) to a second, peak dopant concentration (e.g., between four (4) and ten (10) times higher) at a first depth 3005 (e.g., 0.2 µm) from the surface 3003 of the optimization layer 3002. Between the first depth 3005 and a bottom 3007 of the optimization layer 3002 (e.g., where the optimization layer 3002 and the drift layer 16 meet), the optimization layer 3002 may maintain the peak doping concentration (e.g., 4×-10× higher that the doping concentration at the surface 3003). In certain embodiments, the lower dopant concentration of the optimization layer 3002 may be between about $5\times10^{15}$ $cm^{-3}$ and about $5\times10^{16}$ $cm^{-3}$ (e.g., between about $8\times10^{15}$ $cm^{-3}$ and about $2\times10^{16}$ $cm^{-3}$, or approximately $1\times10^{16}$ $cm^{-3}$), while the peak dopant concentration of the optimization layer 3002 may be between about $5\times10^{16}$ $cm^{-3}$ and about $1\times10^{17}$ $cm^{-3}$. Additionally, in certain embodiments, the peak doping concentration of the optimization layer 3002 may be less than approximately 20% of a doping concentration in the well region 18 and channel region 28 of the device 3000.

It may also be appreciated that device designs and layouts that include the optimization layer 3002 typically have narrower JFET regions 29 (e.g., smaller $W_{JFET,parallel}$ 49) compared to device designs and layouts that lack the optimization layer 3002, and narrower JFET regions 29 can increase the electric fields discussed above, with respect to FIGS. 3-5. With this in mind, present embodiments are directed toward cellular device designs that include the optimization layer 3002, and that incorporate one or more shielding regions that reduce the electric field in the JFET regions 29 (as well as in the gate dielectric layer 24 illustrated in FIG. 1B) in locations where the corners 69 of neighboring device cells meet without significantly increasing $R_{ds}(on)$.

The presently disclosed shielding regions, which are generally referred to herein as "shielding regions within an optimization layer" or (SROLs), are regions of the semiconductor layer that lack the optimization layer (e.g., that interrupt the continuity of the optimization layer 3002) in the widest portion of the JFET region 29, where the corners 69 of neighboring device cells meet. For example, in certain embodiments, the SROLs are epi doped regions of the semiconductor device layer 2 that are masked and, therefore, are not doped during an optimization layer doping process. As discussed below, the disclosed SROLs are designed such that the electric field the widest portion of the JFET region 29 is less than or equal to the electric field in the parallel portion of JFET region. It may be appreciated that present designs maintain a channel region width and/or a JFET region density that is greater than or equal to that of a conventional stripe device (e.g., stripe cell device 41 of FIG. 2) having comparable dimensions (e.g., same $L_{ch}$, $L_{ch\_to\_ohm}$, $W_{ohm}$). As such, the presently disclosed shielded device cells provide superior performance relative to a conventional stripe device cells of comparable dimensions, while still providing similar reliability (e.g., long-term, high-temperature stability). Furthermore, the SROLs may be implanted simultaneously with other features of the device cells, and as such, do not increase the complexity or cost of fabrication.

Figure 7:
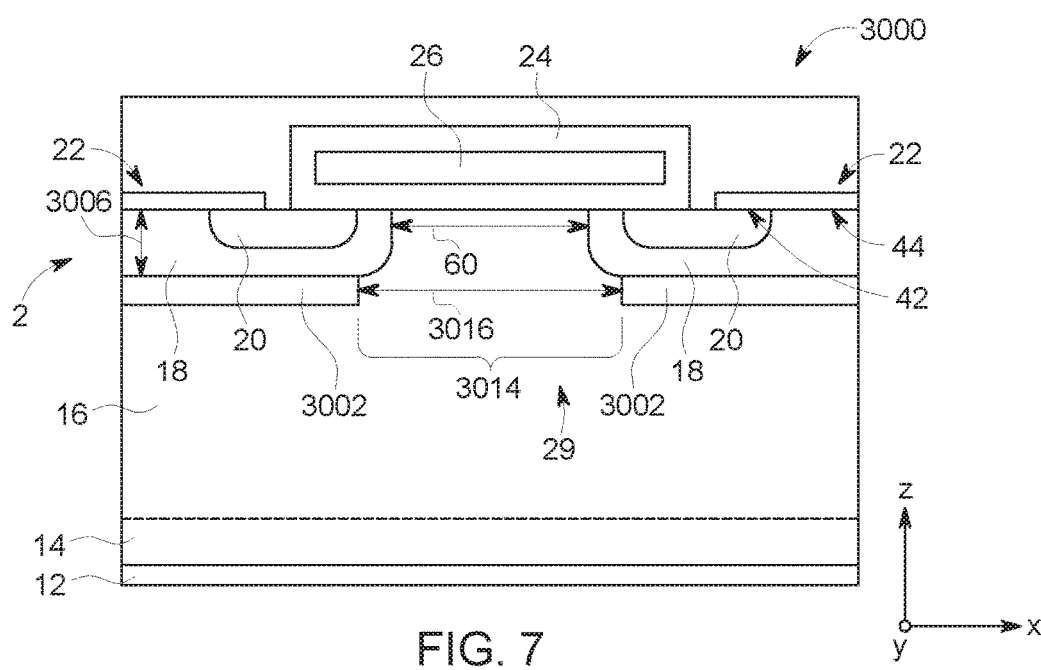
FIG. 7 is cross-sectional schematic of a portion of a MOSFET device having an optimization layer and a shielding region disposed within the optimization layer (SROL), in accordance with embodiments of the present technique.
Figure 8:
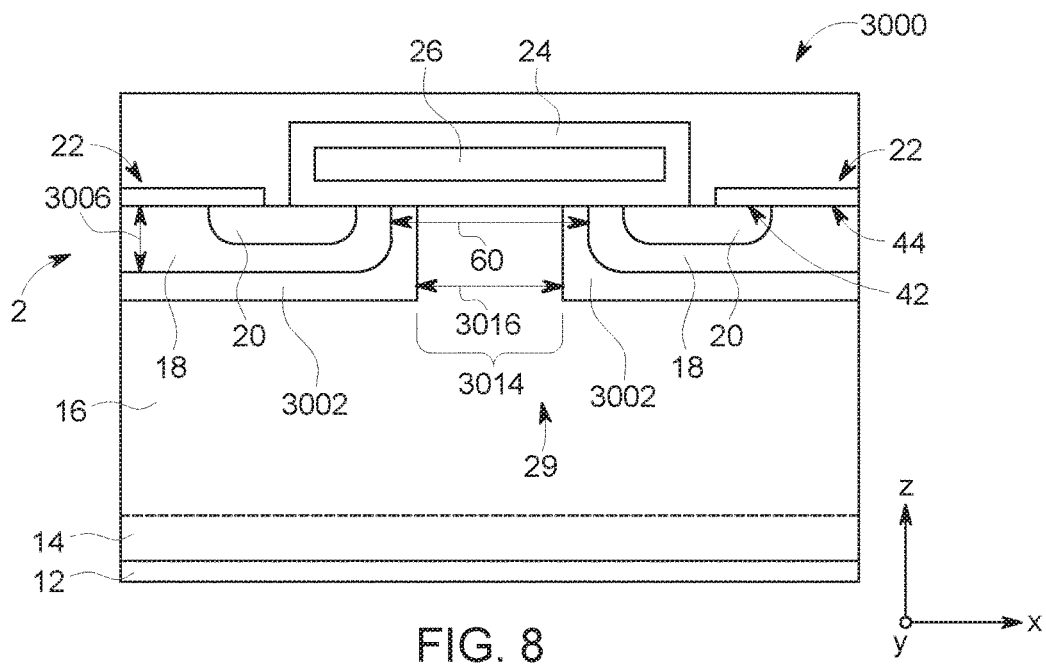
FIG. 8 is cross-sectional schematic of a portion of a MOSFET device having an optimization layer and having another embodiment of a SROL, in accordance with embodiments of the present technique.

For example, FIG. 7 illustrates a cross-sectional schematic of a portion of the JFET region 29 of the semiconductor device 3000 illustrated in FIG. 6 having the greatest width 60 (e.g., where the corners 69 of neighboring device cells meet). As illustrated, a SROL 3014 is disposed in the widest portion of the JFET region 29 and interrupts the continuity of the optimization layer 3002. Additionally, the SROL 3014 illustrated in FIG. 7 has a dimension 3016 (e.g., a width 3016) that is greater than a distance 60 between the well regions 18 of the neighboring device cells in the widest portion of the JFET region 29. As such, the SROL 3014 extends into or overlaps with portions of the well regions 18 of the device cells. In other words, for the embodiment illustrated in FIG. 7, portions of the well regions 18 are disposed inside of (e.g., disposed within, occupies a portion of) the optimization layer 3002, while other portions of the well regions 18 are disposed outside of (e.g., beyond, not within) the optimization layer 3002. As such, the SROL 3014 illustrated in FIG. 7 may be described herein as partially extending into (e.g., overlapping with) the well regions 18, or, alternatively, the well regions 18 may be described herein as being partially inside of (e.g., within) the SROL 3014. In other embodiments, the dimension 3016 of the SROL 3014 may not extend into or overlap with the well regions 18. For example, FIG. 8 illustrates a cross-sectional schematic of a portion of a semiconductor device 3000 in which a SROL 3014 is disposed in a widest portion of the JFET region 29 and interrupts the optimization layer 3002 in the JFET region 29. However, for the embodiment illustrated in FIG. 8, a dimension 3016 (e.g., a width 3016) of the SROL 3014 is less than the distance 60 between the well regions 18 of the neighboring device cells in the widest portion of the JFET region 29. As such, the SROL 3014 illustrated in FIG. 8 does not extend into or overlap with the well regions 18.

Figure 9:
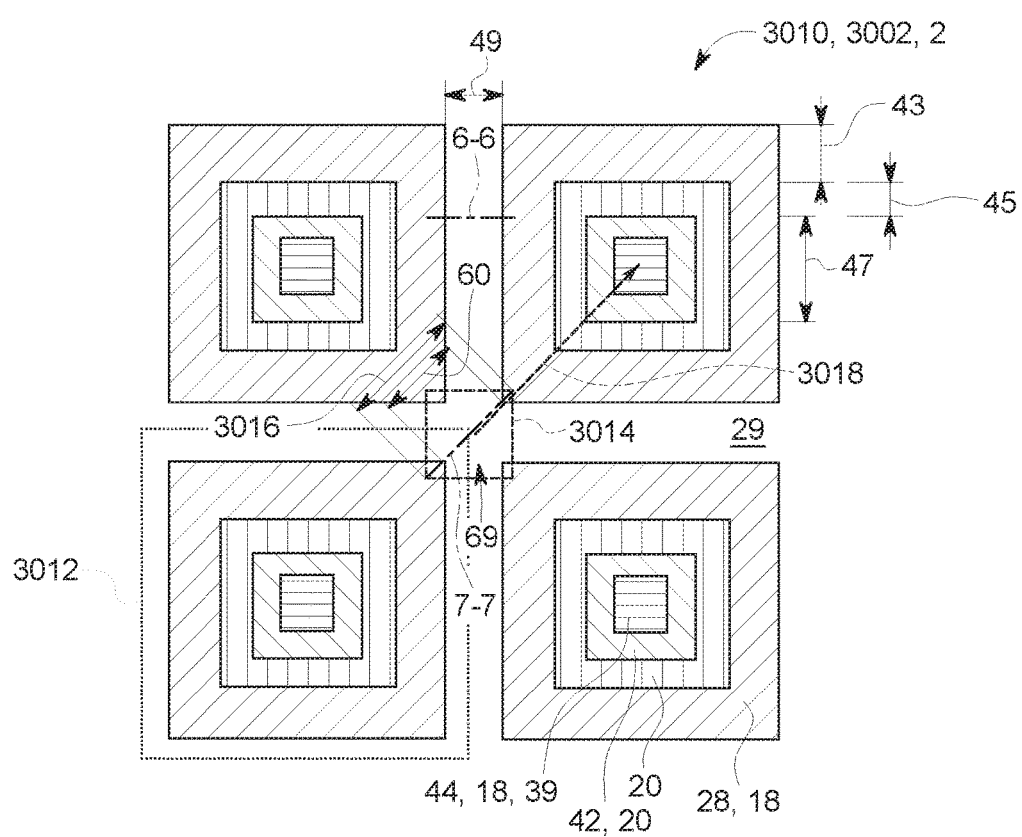
FIG. 9 is a top-down view of a device layout that includes a number of square device cells disposed in a semiconductor device layer having an optimization layer, and further includes a SROL, in accordance with embodiments of the present technique.
Figure 12A:
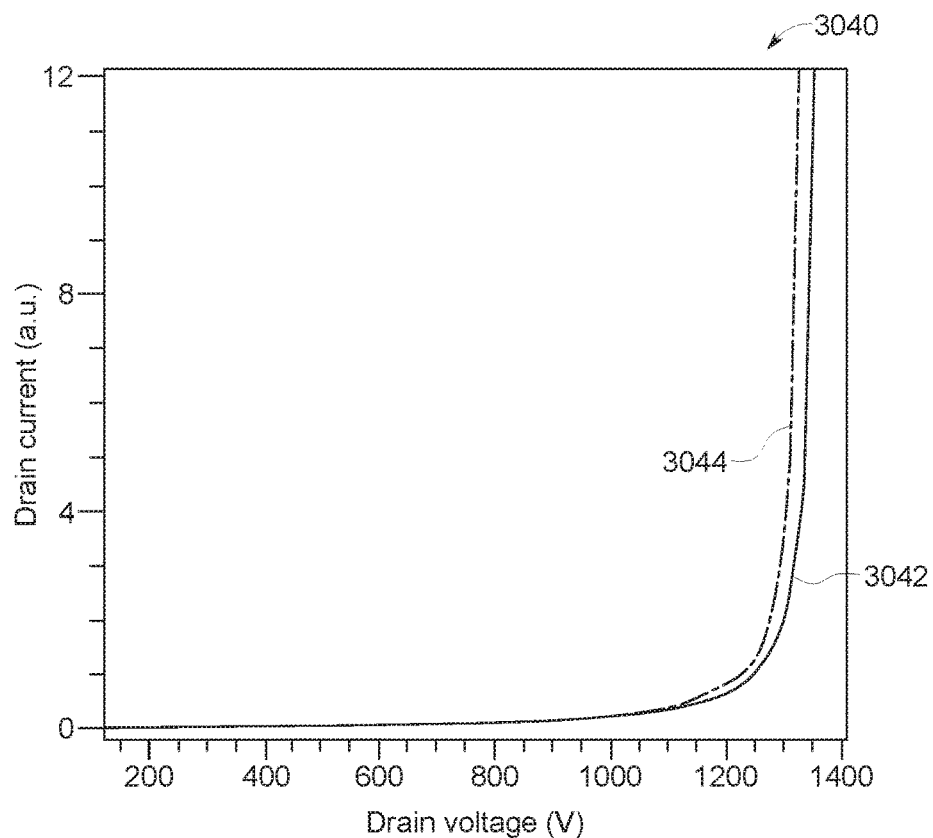
FIG. 12A is a graph depicting drain current (in arbitrary units) versus drain voltage (reverse bias, in volts) for a MOSFET device having an optimization layer and for a MOSFET device having an optimization layer that is shielded by a SROL, in accordance with embodiments of the present technique.
Figure 12B:
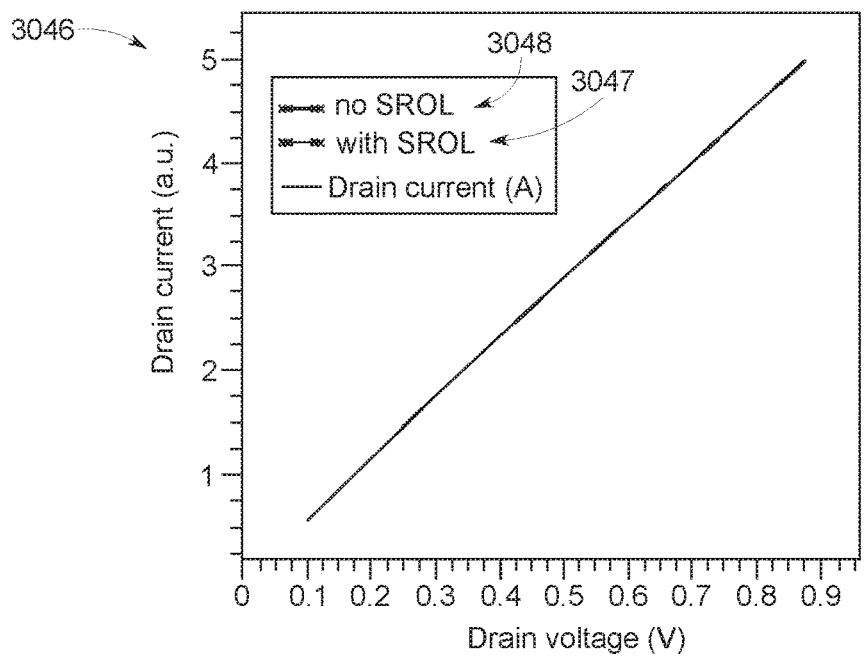
FIG. 12B is a graph depicting drain current (in arbitrary units) versus drain voltage (forward bias, in volts) for a MOSFET device having an optimization layer and for a MOSFET device having an optimization layer that is shielded by a SROL, in accordance with embodiments of the present technique.
Figure 13:
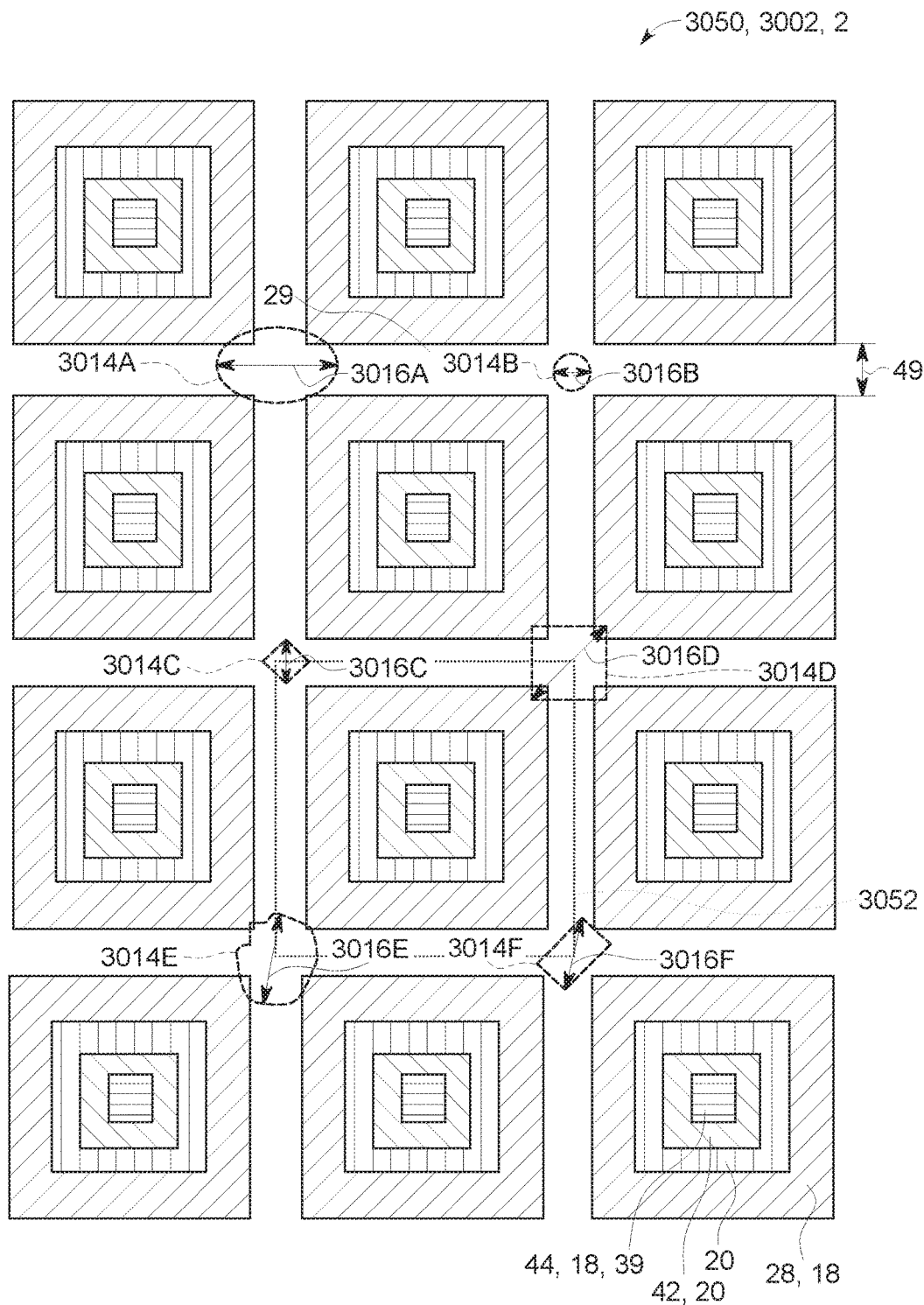
FIGS. 13 and 14 are top-down views of device layouts that include a number of square device cells disposed in a semiconductor device layer with an optimization layer, and further includes different examples of SROLs, in accordance with embodiments of the present technique.
Figure 14:
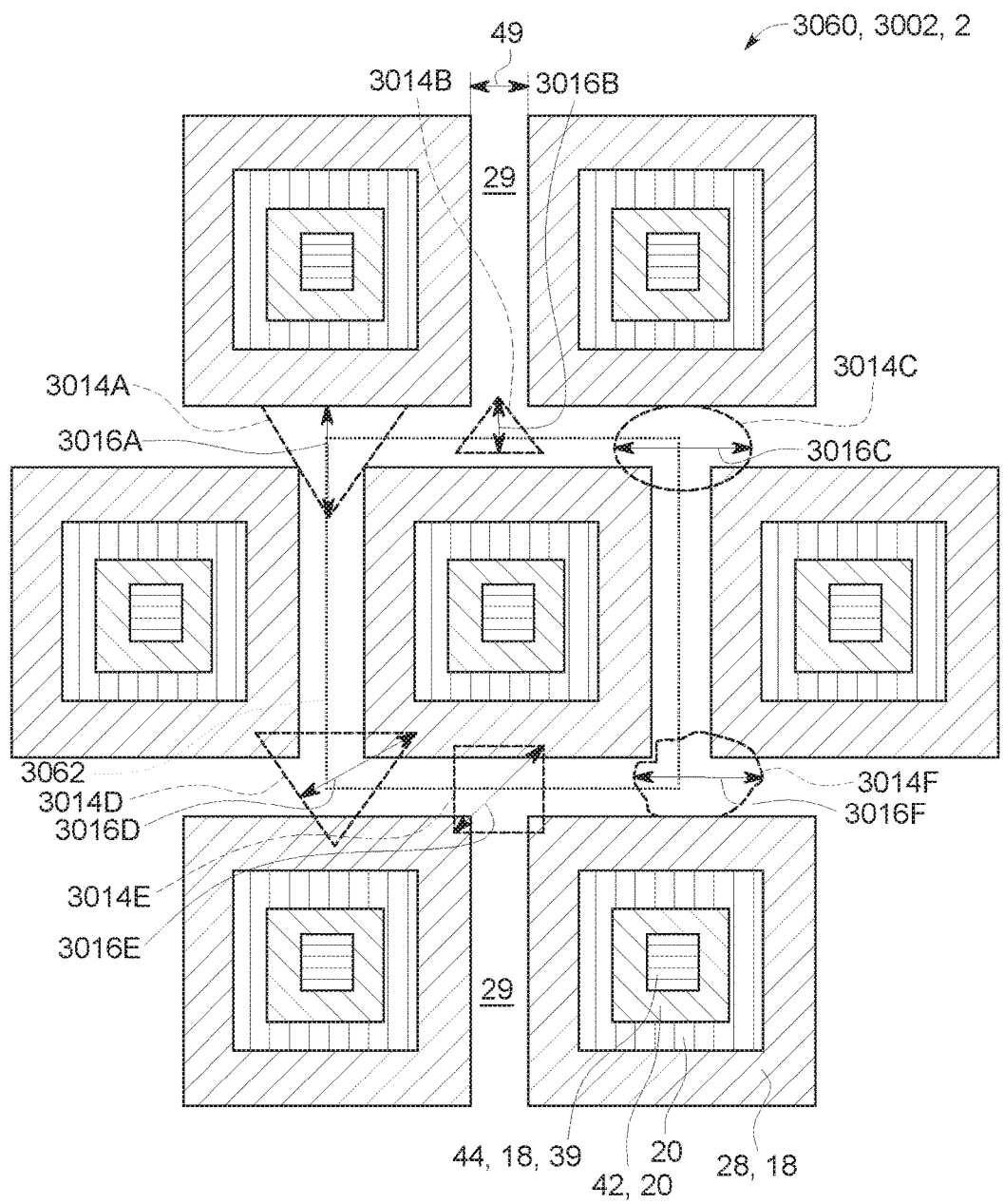
Figure 15:
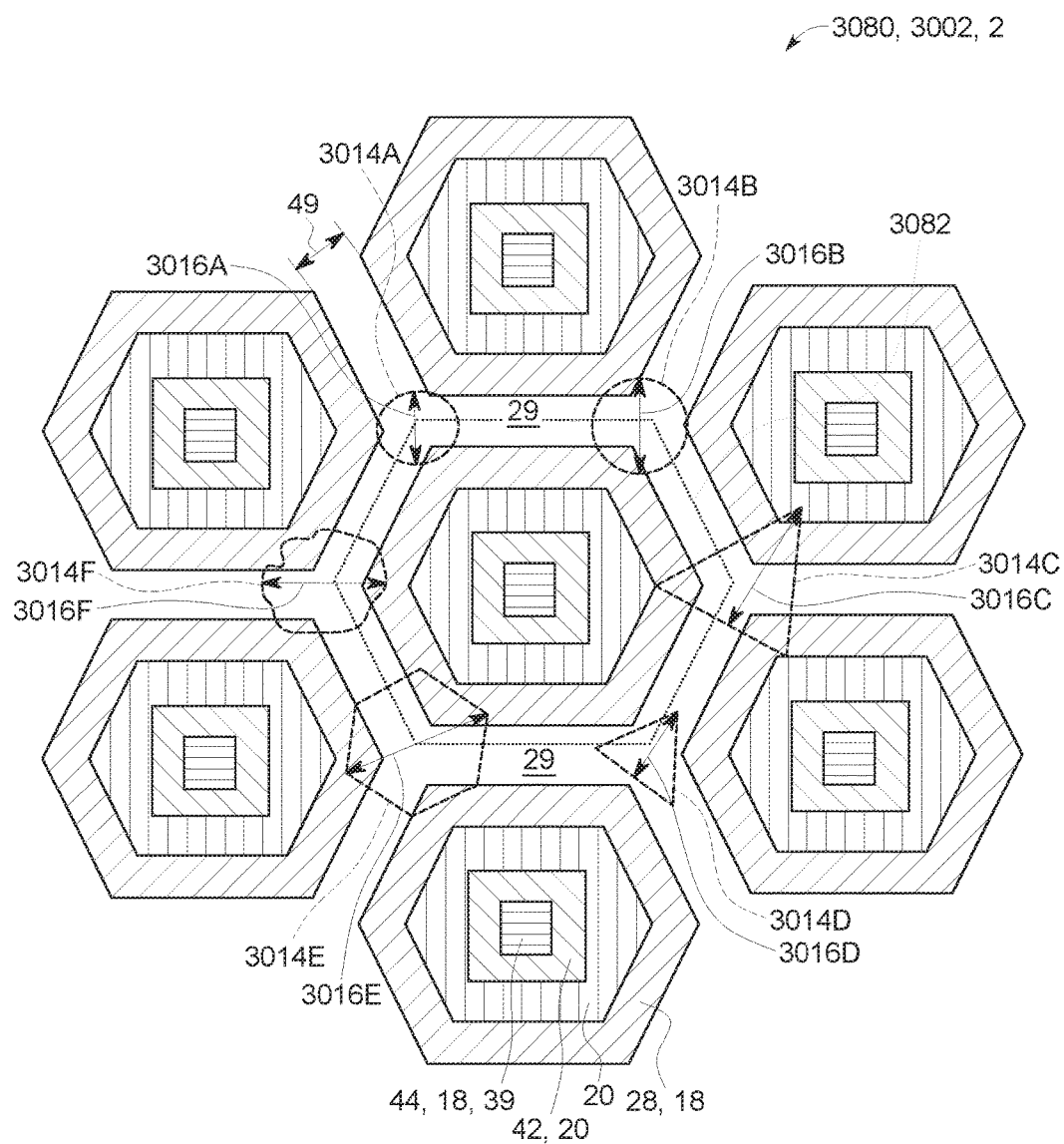
FIG. 15 is a top-down view of a device layout that includes a number of hexagonal device cells disposed in a semiconductor device layer having an optimization layer, and further includes different examples of SROLs, in accordance with embodiments of the present technique.
Figure 16:
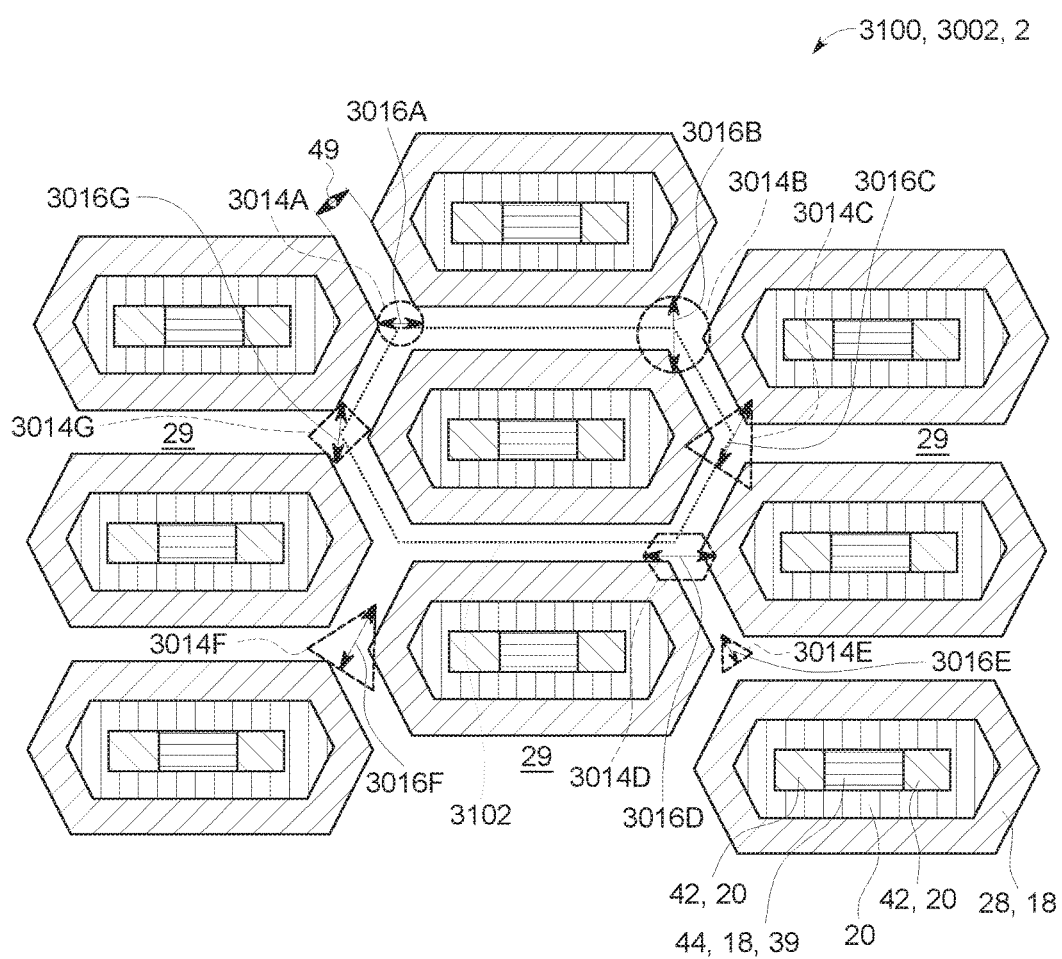
FIGS. 16 and 17 are top-down views of device layouts that include a number of elongated hexagonal device cells disposed in a semiconductor device layer having an optimization layer, and further includes different examples of SROLs, in accordance with embodiments of the present technique.
Figure 17:
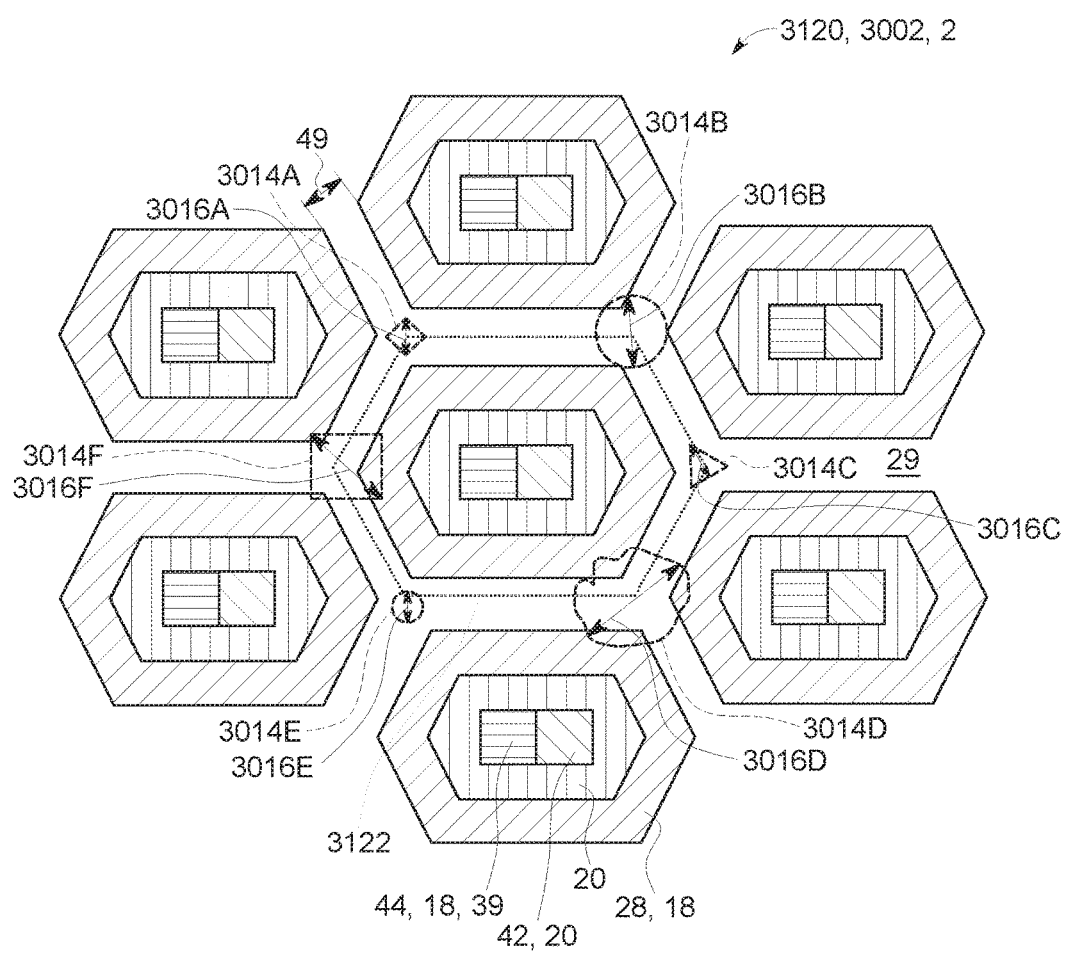
Figure 18:
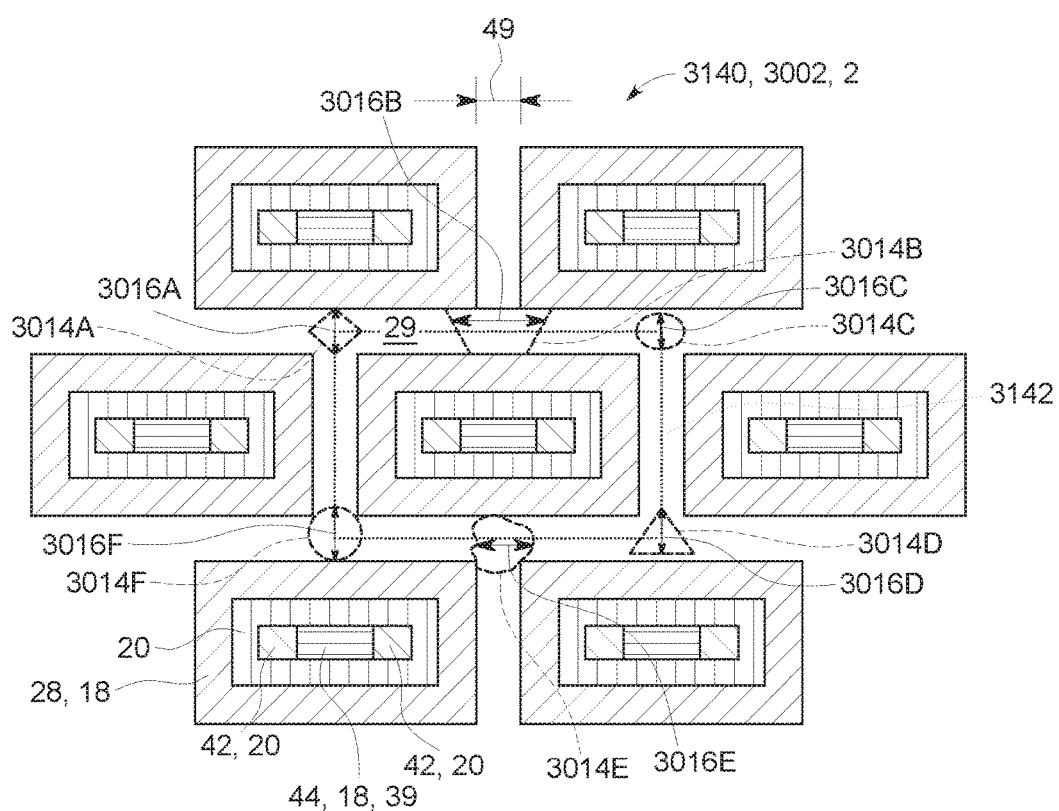
FIGS. 18 and 19 are a top-down views of device layouts that include a number of elongated rectangular device cells disposed in a semiconductor device layer having an optimization layer, and further includes different examples of SROLs, in accordance with embodiments of the present technique.
Figure 19:
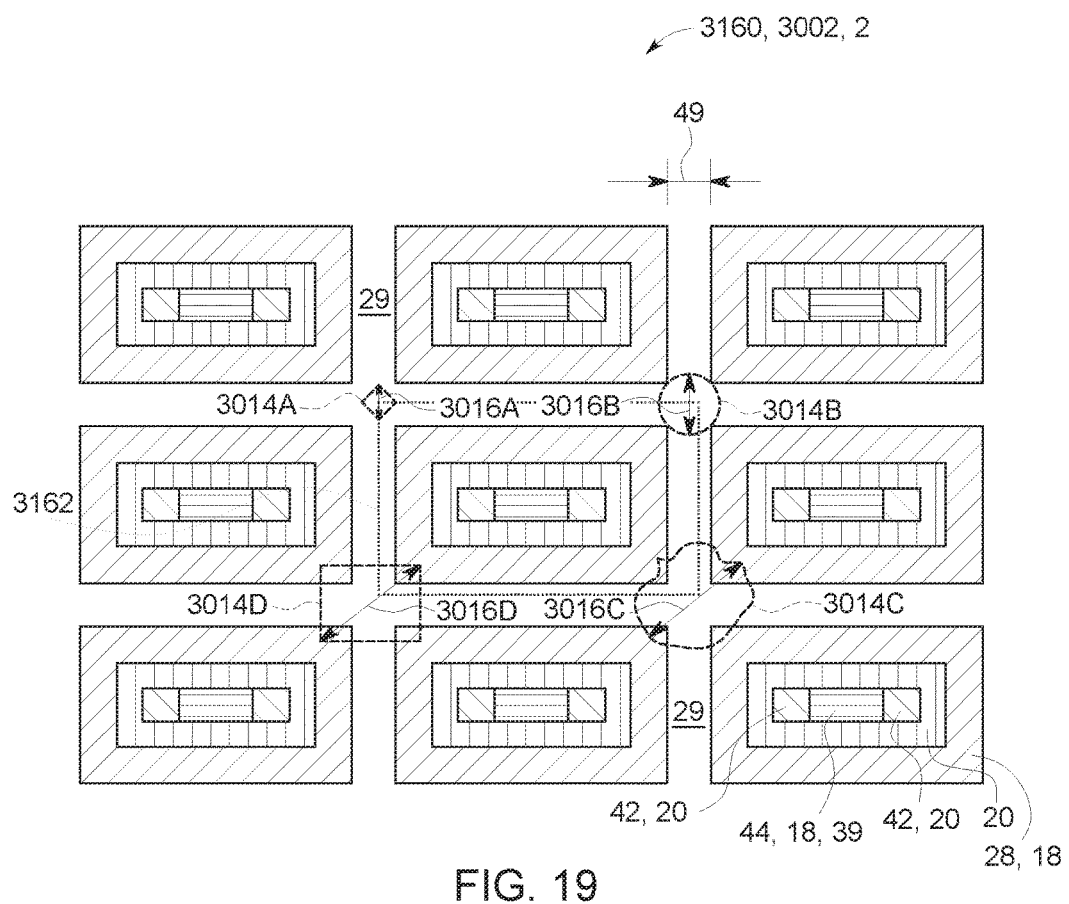

With the forgoing in mind, FIGS. 9 and 12-19 illustrate top-down views of embodiments of a semiconductor device layer 2 with various device cells and layouts that include an optimization layer 3002 and one or more SROLs 3014 to reduce the electric field in the portion of JFET region between the well regions of neighboring device cells. More specifically, FIGS. 9, 13, and 14 illustrate example layouts of square device cells and SROLs of various shapes and sizes, FIG. 15 illustrates an example layout of hexagonal device cells and SROLs of various shapes and sizes, FIGS. 16 and 17 illustrate example layouts of elongated hexagonal device cells and SROLs of various shapes and sizes, FIGS. 18 and 19 illustrate example layouts of elongated rectangular device cells and SROLs of various shapes and sizes, in accordance with embodiments of the present approach. The elongated rectangular device cells of FIGS. 18-19 and the elongated hexagonal device cells of FIGS. 16 and 17 may include one or more features described in co-pending U.S. patent application Ser. Nos. 14/313,785 and 14/313,820, both entitled, "CELLULAR LAYOUT FOR SEMICONDUCTOR DEVICES," both filed Jun. 24, 2014, which are incorporated by reference herein in their entireties for all purposes. It may be appreciated that while a number of different example embodiments of device designs and layouts are presented, these are merely intended to be examples. As such, in other embodiments, SROLs of the present approach may have other shapes (e.g., elongated, irregular, or distorted shapes) without negating the effect of the present approach. It may also be noted that, for efficiency, a number of different example SROL shapes are included in the illustrated device layouts. In certain embodiments, the SROLs of a particular device layout may include only SROLs having a single shape, while in other embodiments, a particular device layout may include SROLs having any suitable number of different shapes, in accordance with the present disclosure. It also may be appreciated that the channel and/or JFET density of the disclosed cellular layout embodiments illustrated in FIGS. 9 and 12-19 is generally greater than that of a stripe device layout 41, as illustrated in FIG. 2, having the same process/technology limited design parameters.

FIG. 9 illustrates a device layout 3010 that includes a number of square device cells 3012 and a square shaped SROL 3014 disposed within an optimization layer 3002, in accordance with embodiments of the present technique. It may be noted that, the SROL 3014 has the same conductivity type as the optimization layer 3002 and JFET region 29 (e.g., n-type). Further, the SROL 3014 is doped at a lower level (e.g., 2×-4× lower) than the remainder of the optimization layer 3002 and JFET region 29 of FIG. 9 (e.g., having a doping concentration similar to drift layer 16). It may also be noted that FIG. 6, discussed above, generally corresponds to a cross-sectional view of the semiconductor surface 2 illustrated in FIG. 9 taken along line 6-6, while FIG. 7 generally corresponds to a cross-sectional view taken alone line 7-7. As noted above, the continuity of the optimization layer 3002 is interrupted by the SROL 3014, and since the dimension 3016 (e.g., width 3016) of the SROL 3014 is greater than the distance 60 between neighboring device cells in the widest portion of the JFET region 29, the SROL 3014 overlaps with or extends into a portion of the well regions channel regions 28/well regions 18 of each of the adjacent device cells 3012. As mentioned, in certain embodiments, the optimization layer 3002 may be formed by a blanket deposition of the semiconductor device layer 2, and for such embodiments, the SROL 3014 may be formed by masking a portion of the semiconductor device layer 2 before doping (e.g., implantation) the semiconductor device layer 2 to form the optimization layer 3002. For example, in certain embodiments, masking may involve using a patterned photoresist layer, and the semiconductor device layer 2 may subsequently be doped via implantation at a temperature less than 500° C. In certain embodiments, a hard masking material may be used, such as silicon oxide ($SiO_2$), silicon nitride ($SiN_x$), a metal, or a combination thereof, which may enable higher energy/temperature implantation. In particular, in certain embodiments, this doping may be the first doping of the semiconductor device layer 2 (e.g., after epi doping). By having a reduced the doping concentration in the portion of the JFET region 29 between the well regions 18 of neighboring device cells, the SROL 3014 generally reduces the magnitude of the electric field between the well regions 18 of neighboring device cells under reverse bias, thereby improving device reliability.

The SROL 3014 illustrated in FIG. 9 has a dimension 3016 (e.g., a width 3016) substantially greater than $W_{JFET,parallel}$ 49, and therefore, the SROL 3014 extends to meet (e.g., extends into) the edges of the well regions 18 of the adjacent device cells 3012. In other embodiments, the SROL 3014 may not meet or overlap with a portion of a well region 18 of adjacent device cells 3012. In certain embodiments, the SROL 3014 may occupy between approximately 1% and approximately 30% (e.g., between approximately 5% and approximately 20%, between approximately 7% and approximately 15%) of the area of each device cell 3012. As used herein, the "width" of an SROL refers to a largest (e.g., widest, longest) dimension of the SROL when viewed from the surface of the semiconductor device layer 2. In certain embodiments, the width 3016 of the disclosed SROLs (e.g., a diagonal of a polygonal shielding region, diameter of a circular shielding region, longest side or height of a triangular shielding region, largest dimension of an irregular shape, etc.) may be less than approximately 3 μm (e.g., between approximately 0.5 μm and approximately 2.5 μm, between approximately 1 μm and approximately 3 μm).

Figure 10:
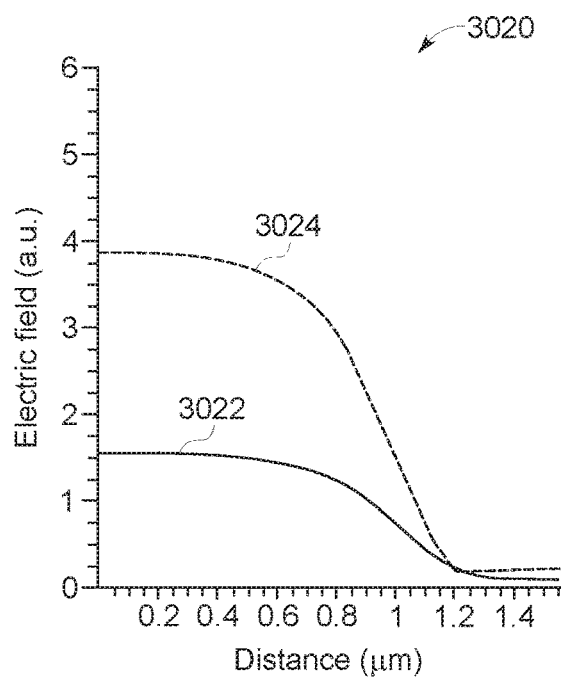
FIG. 10 is a graph depicting normalized electric field strength in a portion of a SiC layer having an optimization layer and in a portion of a dielectric layer disposed over the SiC layer, wherein the portion of the SiC layer is disposed between the corners of the well regions of square device cells that are shielded by a SROL when operating reverse bias, in accordance with embodiments of the present technique.
Figure 11:
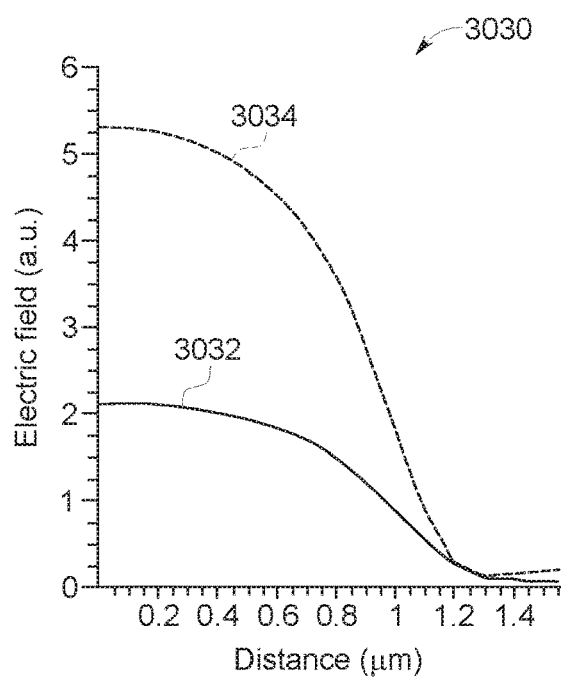
FIG. 11 is a graph depicting normalized electric field strength in a portion of a SiC layer having an optimization layer and in a portion of a dielectric layer disposed over the SiC layer, wherein the portion of the SiC layer is disposed between the corners of the well regions of square device cells that are not shielded by a SROL when operating reverse bias, in accordance with embodiments of the present technique.

As mentioned, the SROL 3014 illustrated in FIG. 9 generally reduces the electric field in the portion of the JFET region 29 between the well regions 18 of neighboring device cells 3012. To illustrate this effect, FIG. 10 is a graph 3020 that plots the normalized electric field strength (in arbitrary units (a.u.)) in the JFET region 29 for an embodiment of a SiC device cell 3012 under reverse bias, wherein the illustrated curves represent the electric field in the device along the diagonal arrow 3018 illustrated in FIG. 9. The graph 3020 of FIG. 10 includes a first curve 3022 illustrating the electric field in the semiconductor device layer 2, and includes a second curve 3024 illustrating the electric field in the dielectric layer 24 disposed over the semiconductor device layer 2 (as illustrated in FIG. 8), for the example SiC device cell 3012 (i.e., 1200 V SiC MOSFET square device cells, having $8 \times 10^{15}$ $cm^{-3}$ epi doping, 11 μm thick drift layer, $W_{JFET,parallel}$ 49=1.3 μm, pitch=8.2 μm, SROL having dimensions of 1.3 μm×1.3 μm) at $V_{ds}$=1200 V. For comparison, FIG. 11 is a graph 3030 that plots the normalized electric field strength (in arbitrary units (au.)) along the diagonal arrow 66 illustrated in FIG. 3 for an example SiC device cell 50 at $V_{ds}$=1200 V, wherein the SiC device cell 50 is the same as the one represented in FIG. 10 (including the optimization layer 3002) except that it lacks a SROL 3014. The graph 3030 of FIG. 11 includes a first curve 3032 illustrating the electric field in the semiconductor device layer 2, and includes a second curve 3034 illustrating the electric field in the dielectric layer 24 disposed over the semiconductor device layer 2 (as illustrated in FIG. 8). Comparing FIGS. 10 and 11, the SROL 3012 provides a substantial reduction (e.g., approximately 25% to 50% reduction) in the electric field in the portion of the JFET region 29 between the well regions 18 of neighboring SiC device cells 3012.

It may be appreciated that the disclosed SROLs 3014 reduce the electric field in the portion of the JFET region 29 between the well regions 18 of neighboring device cells 3012 without significantly impacting the performance of the device. For example, FIGS. 12A and 12B illustrate reverse and forward IV characteristics, respectively, for embodiments of a 1200 V SiC MOSFET device with and without the disclosed SROLs 3014. In particular, FIG. 12A is a graph 3040 illustrating drain current (in arbitrary units (a.u.)) versus drain voltage (in volts) for the device layout 3010 illustrated in FIG. 9 (represented by the curve 3042) and for the same device layout lacking the SROL 3014 (represented by the curve 3044). As indicated by the curve 3042 in the graph 3040, the breakdown voltage of the device layout that includes the SROL 3014 is slightly higher due to better shielding of the corners of the well regions 18 of the device cells 3012. FIG. 12B is a graph 3046 illustrating drain current (in arbitrary units (a.u.)) versus drain voltage (in volts) for the device layout 3010 illustrated in FIG. 9 (represented by the line 3047) and for the same device layout lacking the SROL 3014 (represented by the curve 3048). Accordingly, it may be appreciated that the SROL 3014 illustrated in FIG. 9 does not significantly impact the $R_{ds}$(on) of the illustrated device layout 3010 (e.g., less than 0.1% change).

FIG. 13 illustrates a device layout 3050 that includes a number of square device cells 3052 and a number of SROLs 3014 of various sizes and shapes disposed within an optimization layer 3002, in accordance with embodiments of the present technique. More specifically, the SROL 3014A is substantially ovular, has a width along long axis 3016A, and overlaps with the corners of the well regions 18 of four (e.g., all) adjacent device cells 3052. The SROL 3014B is substantially round or circular, has a width 3016B, and does not overlap with a corner of an adjacent device cell 3052. The SROL 3014C is substantially square-shaped, has a width 3014C, and does not overlap with a corner of an adjacent device cell 3052. The SROL 3014D is substantially square-shaped, has a width of 3016D, and overlaps with the corners of the well regions 18 of four (e.g., all) adjacent device cells 3052. The SROL 3014E has a substantially irregular shape, has a width of 3014E, and overlaps with the corners of the well regions 18 of four (e.g., all) adjacent device cells 3052. The SROL 3014F is substantially rectangular, has a width of 3016F, and overlaps with a corner of one adjacent device cell 3052. It may be appreciated that, in other embodiments, each of the illustrated SROLs 3014A, 3014B, 3014C, 3014D, 3014E, or 3014F may be used alone or in combination with SROLs of different size and or shape, in accordance with the present disclosure. Accordingly, the SROLs 3014A-F reduce the electric field in the portion of the JFET region 29 between the corners of the well regions of neighboring device cells 3052.

FIG. 14 illustrates a device layout 3060 that includes a number of staggered square device cells 3062 and a number of SROLs 3014 of various sizes and shapes disposed within an optimization layer 3002, in accordance with embodiments of the present technique. More specifically, the SROL 3014A is substantially triangular, has a width 3016A, and meets or overlaps with portions of the well regions 18 of three (e.g., all) adjacent device cells 3062. The SROL 3014B is substantially triangular, has a width 3016B, and does not overlap with a portion of an adjacent device cell 3062. The SROL 3014C is substantially ovular, has a width 3016C, and meets or overlaps with a portions of the well regions 18 of three (e.g., all) adjacent device cells 3062. The SROL 3014D is substantially triangular, has a width 3016D, and overlaps with portions of the well regions 18 of three (e.g., all) adjacent device cells 3062. The SROL 3014E has a substantially square shape, has a width 3016E, and meets or overlaps with portions of the well regions 18 of three (e.g., all) adjacent device cells 3062. The SROL 3014F is substantially irregular in shape, has a width 3016F, and meets or overlaps with portions of the well regions 18 of three (e.g., all) adjacent device cells 3062. Accordingly, the SROLs 3014A-F reduce the electric field in the portion of the JFET region 29 between the corners of the well regions of neighboring device cells 3062.

FIG. 15 illustrates a device layout 3080 that includes a number of staggered hexagonal device cells 3082 and a number of SROLs 3014 of various sizes and shapes disposed within an optimization layer 3002, in accordance with embodiments of the present technique. More specifically, the SROL 3014A is substantially circular, has a width 3016A, and meets with portions of the well regions 18 of three (e.g., all) adjacent device cells 3082. The SROL 3014B is also substantially circular, has a width 3016B, and overlaps with a portion of three (e.g., all) adjacent device cells 3082. The SROL 3014C is substantially triangular, has a width 3016B, and overlaps with a portions of the well regions 18 and portions of the source regions 20 of three (e.g., all) adjacent device cells 3082. The SROL 3014D is substantially triangular, has a width 3016D, and does not overlap with a portion of a well region 18 of an adjacent device cell 3082. The SROL 3014E is substantially hexagonal, has a width 3016E, and overlaps with portions of the well regions 18 of three (e.g., all) adjacent device cells 3082. The SROL 3014F is substantially irregular in shape, has a width 3016F, and meets or overlaps with portions of the well regions 18 of three (e.g., all) adjacent device cells 3082. Accordingly, the SROLs 3014A-F reduce the electric field in the portion of the JFET region 29 between the corners of the well regions of neighboring device cells 3082.

FIG. 16 illustrates a device layout 3100 that includes a number of elongated hexagonal device cells 3102 and a number of SROLs 3014 of various sizes and shapes disposed within an optimization layer 3002, in accordance with embodiments of the present technique. More specifically, the SROL 3014A is substantially circular, has a width 3016A, and meets with portions of the well regions 18 of two out of three adjacent device cells 3102. The SROL 3014B is also substantially circular, has a width 3016B, and overlaps with a portion of three (e.g., all) adjacent device cells 3102. The SROL 3014C is substantially triangular, has a width 3016C, and overlaps with a portions of the well regions 18 of three (e.g., all) adjacent device cells 3102. The SROL 3014D is an elongated hexagon, has a width 3016D, and overlaps with a portion of the well regions 18 of two out of three adjacent device cells 3102. The SROL 3014E is substantially triangular, has a width 3016E, and does not overlap with a portion of a well region 18 of an adjacent device cell 3102. The SROL 3014F is substantially triangular in shape, has a width 3016F, and meets or overlaps with portions of the well regions 18 of two out of three adjacent device cells 3102. The SROL 3014G is substantially rectangular, has a width 3016G, and meets with portions of the well regions 18 of three (e.g., all) adjacent device cells 3102. Accordingly, the SROLs 3014A-G reduce the electric field in the portion of the JFET region 29 between the corners of the well regions of neighboring device cells 3102.

FIG. 17 illustrates a device layout 3120 that includes a number of elongated hexagonal device cells 3122 and a number of SROLs 3014 of various sizes and shapes disposed within an optimization layer 3002, in accordance with embodiments of the present technique. More specifically, the SROL 3014A is substantially square-shaped, has a width 3016A, and does not meet or overlap with a well region 18 of an adjacent device cell 3122. The SROL 3014B is substantially circular, has a width 3016B, and overlaps with a portion of three (e.g., all) adjacent device cells 3122. The SROL 3014C is substantially triangular, has a width 3016C, and does not meet or overlap with a portion of a well region 18 of an adjacent device cell 3122. The SROL 3014D has an irregular shape, has a width 3016D, and overlaps with portions of the well regions 18 of three (e.g., all) adjacent device cells 3122. The SROL 3014E is substantially circular, has a width 3016E, and does not overlap with a portion of a well region 18 of an adjacent device cell 3122. The SROL 3014F is substantially rectangular, has a width 3016F, and meets or overlaps with portions of the well regions 18 of three (e.g., all) adjacent device cells 3122. Accordingly, the SROLs 3014A-F reduce the electric field in the portion of the JFET region 29 between the corners of the well regions of neighboring device cells 3122.

FIG. 18 illustrates a device layout 3140 that includes a number of staggered, elongated rectangular device cells 3142 and a number of SROLs 3014 of various sizes and shapes disposed within an optimization layer 3002, in accordance with embodiments of the present technique. More specifically, the SROL 3014A is substantially square-shaped, has a width 3016A, and does not meet or overlap with a well region 18 of an adjacent device cell 3142. The SROL 3014B is substantially trapezoidal, has a width 3016B, and overlaps with a portion of three (e.g., all) adjacent device cells 3142. The SROL 3014C is substantially circular, has a width 3016C, and does not meet or overlap with a portion of a well region 18 of an adjacent device cell 3142. The SROL 3014D is substantially triangular, has a width 3016D, and does not overlap with a portion of a well region 18 of an adjacent device cell 3142. The SROL 3014E has an irregular shape, has a width 3016E, and meets or overlaps with a portion of the well regions 18 of three (e.g., all) adjacent device cells 3142. The SROL 3014F is substantially circular, has a width 3016F, and meets or overlaps with portions of the well regions 18 of three (e.g., all) adjacent device cells 3142. Accordingly, the SROLs 3014A-F reduce the electric field in the portion of the JFET region 29 between the corners of the well regions of neighboring device cells 3122.

FIG. 19 illustrates a device layout 3160 that includes a number of aligned elongated rectangular device cells 3162 and a number of SROLs 3014 of various sizes and shapes disposed within an optimization layer 3002, in accordance with embodiments of the present technique. More specifically, the SROL 3014A is substantially square-shaped, has a width 3016A, and does not meet or overlap with a well region 18 of an adjacent device cell 3162. The SROL 3014B is substantially ovular, has a width 3016B, and meets or overlaps with a portion of the well region 18 of four (e.g., all) adjacent device cells 3162. The SROL 3014C has an irregular shape, has a width 3016C, and overlaps with a portion of the well regions 18 of four (e.g., all) an adjacent device cell 3162. The SROL 3014D is substantially square-shaped, has a width 3016D, and overlaps with portions of the well regions 18 of four (e.g., all) adjacent device cells 3162. Accordingly, the SROLs 3014A-D reduce the electric field in the portion of the JFET region 29 between the corners of the well regions of neighboring device cells 3162.

Technical effects of the present disclosure include cellular device designs that incorporate an optimization layer and one or more shielding regions within the optimization layer (SROLs) that reduce the electric field in what would be the widest portion of JFET regions, between the well regions of neighboring device cells, without significantly increasing $R_{ds}$(on). The disclosed SROLs reduce electrical fields in this portion of the JFET region, while maintaining a channel region width and/or a JFET region density that is greater than that of a conventional stripe device of comparable dimensions. Accordingly, the presently disclosed shielded device cells provide superior performance relative to a conventional stripe device of comparable dimensions, while still providing similar reliability (e.g., long-term, high-temperature stability at reverse bias).

The invention claimed is:

1. A device, comprising:
a plurality of device cells at least partially disposed in a semiconductor device layer having a first conductivity type, wherein each device cell of the plurality of device cells comprises:
a drift layer having the first conductivity type;
an optimization layer extending from a surface of the semiconductor device layer to the drift layer and having the first conductivity type, wherein the optimization layer has an average doping concentration that is greater than an average doping concentration of the drift layer;
a source region having the first conductivity type at least partially disposed within the optimization layer;
a channel region having a second conductivity type at least partially disposed within the optimization layer adjacent to the source region; and
a junction field-effect transistor (JFET) region having the first conductivity type and a second doping concentration disposed within the optimization layer between the channel regions of the plurality of device cells, wherein the JFET region has a parallel JFET width between a well region of the device cell and a parallel portion of a well region of a neighboring device cell; and
a plurality of shielding regions disposed within the optimization layer (SROLs) having the first conductivity type and a first doping concentration, wherein the plurality of SROLs are at least partially disposed within a portion of the JFET region between the channel regions of neighboring device cells of the plurality of device cells, wherein the optimization layer has a retrograde doping profile that increases in doping concentration between a first dopant concentration at the surface of the semiconductor device layer and a second dopant concentration at a first depth from the surface of the semiconductor device layer, and maintains the second dopant concentration between the first depth and the drift region of the semiconductor layer, wherein the second dopant concentration is between four (4) and ten (10) times greater than the first dopant concentration.

2. The device of claim 1, wherein the first depth is between 0.15 μm and 0.3 μm, the first dopant concentration is between $5 \times 10^{15}$ cm$^{-3}$ and $5 \times 10^{16}$ cm$^{-3}$, and the second dopant concentration is between $5 \times 10^{16}$ cm$^{-3}$ and $1 \times 10^{17}$ cm$^3$.

3. The device of claim 1, wherein the second dopant concentration is less than 20% of an average dopant concentration of the channel region.

4. The device of claim 1, wherein the semiconductor device layer is a silicon carbide (SiC) semiconductor device layer.

5. The device of claim 1, wherein each of the plurality of SROLs overlaps with a portion of the well region of at least one device cell of the plurality of device cells.

6. The device of claim 5, wherein each of the plurality of SROLs overlaps with a portion of the well regions of at least two device cells of the plurality of device cells.

7. The device of claim 6, wherein each of the plurality of SROLs overlaps with a portion of the well regions of at least three device cells of the plurality of device cells.

8. The device of claim 5, wherein the plurality of SROLs further overlaps with a portion of the source regions of the plurality of device cells.

9. The device of claim 1, wherein the plurality of SROLs do not overlap with the well regions of the plurality of device cells.

10. The device of claim 1, wherein the plurality of SROLs occupies between approximately 1% and approximately 30% of an area of each of the plurality of device cells.

11. The device of claim 10, wherein the plurality of SROLs occupies between approximately 5% and approximately 20% of the area of each of the plurality of device cells.

12. The device of claim 11, wherein the plurality of SROLs occupies between approximately 7% and approximately 15% of the area each of the plurality of device cells.

13. The device of claim 1, wherein each of the plurality of SROLs comprises a respective width that is between approximately 0.5 μm and approximately 5 μm.

14. The device of claim 13, wherein the respective width is between approximately 1 μm and approximately 3 μm.

15. The device of claim 1, wherein the plurality of SROLs has a substantially triangular, circular, ovular, hexagonal, rectangular, or irregular shape.

16. The device of claim 1, wherein the device is a metal-oxide-semiconductor field effect transistor (MOSFET), an insulated gate bipolar transistor (IGBT), or an insulated base MOS-controlled thyristor (IBMCT).

17. The device of claim 1, wherein the average doping concentration of the optimization layer is between two (2) and fifteen (15) times greater than the average doping concentration of the drift layer.

18. The device of claim 1, wherein each of the plurality of SROLs has a doping concentration that is substantially the same as a doping concentration of the drift layer.

* * * * *